(12) United States Patent
Li et al.

(10) Patent No.: US 6,284,149 B1
(45) Date of Patent: Sep. 4, 2001

(54) HIGH-DENSITY PLASMA ETCHING OF CARBON-BASED LOW-K MATERIALS IN A INTEGRATED CIRCUIT

(75) Inventors: Zongyu Li, Cupertino, CA (US); Karsten Schneider, Dresden; Axel Walter, Voerde, both of (DE); Jian Ding, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/156,956

(22) Filed: Sep. 18, 1998

(51) Int. Cl.$^7$ .................................................. H01L 21/033

(52) U.S. Cl. .................. 216/64; 216/67; 216/72; 438/710; 438/725

(58) Field of Search ................................. 216/64, 67, 68, 216/72, 81; 438/710, 725

(56) References Cited

U.S. PATENT DOCUMENTS

| 5,262,279 | 11/1993 | Tsang et al. | 430/311 |
| 5,679,608 | 10/1997 | Cheung et al. | 437/195 |
| 6,114,250 | * 9/2000 | Ellingboe et al. | 438/709 |

FOREIGN PATENT DOCUMENTS

| 840365-A2 | 5/1998 | (EP) . |

OTHER PUBLICATIONS

Anonymous, "Cyclotene 5021: Integrated Circuit Dielectric Systems: Processing Procedures,"Dow Chemical Company, Midland, MI, Dec. 1996, 2 pp.

Lii et al., "Low dielectric Dow Cyclotene 3022 (BCB) etch for multilevel interconnection integration," Proceedings of Fifth International Symposium on Ultra Large Scale Integration Science and Technology, Reno, Nevada May 23–26 1995, Electrochemical Society Proceedings, vol. 95–5, 1995, pp. 266–274.

Flanner et al., "Etching characteristics of the low dielectric constant material Cyclotene*5021 (BCB) in the LAM TCP 9100 Etcher," 1998 Proceedings Fourth International Dielectrics for ULSI Multilevel Interconnection Conference (DUMIC), Feb. 16–17, 1998, Santa Clara, California, DUMIC Catalog No. 98IMIC–333D, pp. 61–64.

* cited by examiner

*Primary Examiner*—Randy Gulakowski
*Assistant Examiner*—Allan Olsen
(74) *Attorney, Agent, or Firm*—Charles Guenzer

(57) ABSTRACT

A plasma etching process for etching a carbon-based low-k dielectric layer in a multi-layer inter-level dielectric. The low-k dielectric may be divinyl siloxane-benzocyclobutene (BCB), which contains about 4% silicon, the remainder being carbon, hydrogen, and a little oxygen. The BCB etch uses an etching gas of oxygen, a fluorocarbon, and nitrogen and no argon. An $N_2/O_2$ ratio of between 1:1 and 3:1 produces vertical walls in the BCB. In a dual-damascene structure, the inter-level dielectric includes two BCB layers, each underlaid by a respective stop layer. Photolithography with an organic photoresist needs a hard mask of silicon oxide or nitride over the upper BCB layer. After the BCB etch has cleared all the photoresist, the bias power applied to the cathode supporting the wafer needs to be set to a low value while the separately controlled plasma source power is set reasonably high, thereby reducing faceting of the exposed hard mask. Chamber pressures of no more than 5 milliTorr increase the selectivity of BCB over photoresist. Substrate temperatures of less than 0° C. increase the BCB etch rate. A low fluorocarbon flow increases the etch rate, but a minimum amount of fluorocarbon is required for the silicon component of BCB. In a counterbore dual-damascene etch, the lower stop layer is composed of nitride, and the preferred fluorocarbon is difluoroethane ($CH_2F_2$). A silicon-free carbon-based low-k dielectric can be etched under similar chamber conditions with a etching gas of oxygen and nitrogen in about equal amounts but including no fluorocarbon nor argon.

44 Claims, 10 Drawing Sheets

HIGH-DENSITY PLASMA ETCHING OF CARBON-BASED LOW-K MATERIALS IN A INTEGRATED CIRCUIT

FIELD OF THE INVENTION

The invention relates generally to etching of materials. In particular, the invention relates to plasma etching of carbon-based materials included in integrated circuit chips.

BACKGROUND ART

The level of integration and speed in semiconductor integrated circuits continue to increase. The next generation of dynamic memories will have a capacity of 256 Mb and that of microprocessors will have upwards of ten million transistors. Further generations are being planned. Clock rates are exceeding 300 MHz and are expected to exceed 1 GHz. The increased level of integration has been accomplished in part by shrinking the lateral sizes of the individual components.

However, the increasing proximity of features, in particular the long conductive interconnects extending horizontally on a complex integrated circuit, has introduced the problem of unintended interactions between those features. A complex integrated circuit must include a large number of horizontal interconnects linking active circuits in one part of the integrated circuit to those in another part. Simultaneous with the decrease in feature sizes, the overall size of the integrated circuit has continued to somewhat increase. As a result, the length of the interconnects, which are often laid in parallel for a sizable distance of their runs, has increased or at the best not decreased, and their separation in the horizontal plane has significantly decreased. The amount of electrical coupling, more precisely expressed in terms of parasitic capacitance, between such lines is generally proportional to the ratio of their length to their separation. That is, the coupling necessarily increases with decreasing line separation unless the overall size of the chip is reduced, and it is unlikely that chip size will be reduced in the long term.

Although the coupling problem seems to be worse within respective wiring levels, inter-level coupling can occur across the thin inter-level dielectric layers interposed between multiple horizontal wiring levels. In advanced integrated circuits, particularly those of microprocessors and other complex logic, there may be five or more wiring levels to provide the complicated interconnection paths. The thickness of these inter-level dielectric layers appears to be limited at somewhat less 1 $\mu$m because of dielectric breakdown. However, even at these thicknesses, inter-level capacitance and resultant inter-signal coupling can become problems.

Another way of viewing this problem is to consider the RC charging time $\tau$ between a long interconnect and a large grounded neighboring and parallel feature. The charging time may be represented by $$\tau = R \cdot C, \tag{1}$$

where R is the resistance of the conductive interconnect and C is the capacitance between the interconnect and the grounded feature. The equation is somewhat more complicated for inter-line interaction, but the effect is much the same. For the extremely high speed operation required of advanced integrated circuits, the speed may be limited by the time constant associated with interconnects, which can be characterized by a maximum operation frequency $f_{max}$, $$f_{max} < \frac{1}{R \cdot C} \tag{2}$$

although there may be other factors near unity in this relationship. Generally in advanced circuits, the intra-level capacitance between parallel horizontal interconnects, such as in an internal bus extending over a substantial fraction of the chip, rather than the inter-level capacitance limits the operating speed of the chip.

Up till the present time, the increased speed has been accomplished in large part by decreasing the feature size and in particular decreasing the polygate length of the transistor, which increases its speed. However, as the feature sizes decrease below 0.18 $\mu$m, the effects of the metallization begin to dominate. Therefore, the composition of the metallization and the dielectric constant of the insulator begin to dominate.

One of the motivators for changing from aluminum to copper for advanced integrated circuits as the material of the interconnect is to reduce the value of R because of the lower resistivity of copper compared to aluminum, the conventional material as of now. It is greatly desired that this substitution of copper for aluminum as the metallization material not be compromised by a concurrent increase in the value of the inter-line capacitance C across the dielectric material as the feature sizes of integrated circuits further decrease.

The electrical characteristics of a dielectric material are quantified by its resistivity and its dielectric constant. For an insulator in an integrated circuit, the resistivity must be fairly high, approximately $10^{14}$ ohm-cm or higher. The capacitance C of an planar capacitive structure, whether intentional or parasitic, can be represented as $$C = \frac{k \cdot A}{d}, \tag{3}$$

where A is the area of the capacitive plates, d is the gap between the plates, and k is the dielectric constant of the material filling the gap. The relationship is somewhat more complex for interconnects, but the important factors are the same. For an interconnect of constant width, its area A increases with its length L. Reduced dielectric constant k results in reduced capacitance, thus reducing the cross-talk and coupling, thus allowing increased operating speeds.

At the present time, the most common form of inter-level dielectric for integrated circuits is silicon dioxide or related silicate glasses, such as BPSG. These are all silicon-based materials having the approximate chemical composition $SiO_2$. Hereafter, these will be collectively referred to as silica. The dielectric constant k for silica is between 3.9 and 4.2. That for $Si_3N_4$, another common insulating material in present day integrated circuits, is even higher—7.5. For these reasons, there has been much recent interest in low-k dielectrics having a dielectric constant lower than 3.9.

Several low-k materials have been proposed for use as inter-level dielectric. For use in integrated circuit fabrication, any such material should at a minimum be compatible with other conventional chip processing steps. Some proposed low-k materials are silicon-based, for example, fluorinated silica glass (FSG, k=3.5), hydrophobic porous spin on glass (HPS, k=2.5~3), hydrogen-silsesquioxane (HSQ, k=2.5~2.9). Others are carbon-based, as will be discussed later. By a carbon-based material is meant a material containing on an atomic basis more carbon than either or both of silicon or oxygen. In contrast, a silicon-based material contains more silicon than carbon and is typically based on $SiO_2$ or $Si_3N_4$.

An example of an advanced structure to which it is desired to apply low-k dielectrics is a dual-damascene via, illustrated isometrically in FIG. 1. A via is an electrical contact through an inter-level dielectric layer separating two levels of metallization. A substrate 10 includes a copper horizontal interconnect 12 formed in its surface. Over the substrate are formed a lower stop layer 14, a lower dielectric layer 16, an upper stop layer 18, and an upper dielectric layer 20. The stop layers 14, 18 are dielectric layers having etching characteristics different than those of the dielectric layers 16, 20 such that a selective etch can be used which etches the dielectric layer but stops on the stop layer. One or more via holes 22 extend. through the lower dielectric layer 16 and the two stop layers 14, 18 down to corresponding copper interconnects 12, only one being shown in FIG. 1. The portion of the lower stop layer 14 at the bottom of the via hole 22 is removed in a post-etch soft plasma treatment following the main etching steps. A trench 24 extends through the upper dielectric layer 20 and connects at its bottom with the via holes 22.

There are two principal techniques for forming the dual-damascene structure, the self-aligned process and the counterbore dual-damascene process. In the self-aligned dual-damascene process, the lower stop layer 14, the lower dielectric layer 16, and the upper stop layer 18 are first deposited. Then, a photolithographic step forms an incomplete via hole principally in the upper stop layer 18. Thereafter, the upper dielectric layer 20 is deposited, and a photomask is formed over the area of the trench 24. A single etching step that selectively etches dielectric to material of both stop layers 18, 14 forms both the trench 24 in the upper dielectric layer 20 and the via 22 in the lower dielectric layer 16. On the other hand, in the counterbore dual-damascene process, both stop layers 14, 18 and both dielectric layers 16, 20 are deposited before a first photolithographic step etches an extended via hole from the top of the upper dielectric layer 20 to the lower stop layer 14. Then a second photolithographic step etches the trench 24 but stops on both stop layers 14, 18.

Once the structure of FIG. 1 has been formed, a metallization stack is deposited into the via holes 22 and the trench 24 in one deposition sequence, and the metal likely overflows over the top surface 26 of the upper dielectric. Chemical mechanical polishing (CMP) is then performed to remove all of the metallization above the upper dielectric surface 26. The metal filling the trench 24 provides for upper-level horizontal interconnects, and the metal filling the via holes 22 provides for inter-level vertical interconnects. The chemical mechanical polishing of a dual-damascene structure is particularly useful with copper metallization since it allows definition of copper vias and interconnects without a copper etching step. Copper is difficult to etch in a dry plasma, and presently available copper plasma etches are more expensive than the dual-damascene process.

The process of forming the dual-damascene structure of FIG. 1 is fairly well developed when the two dielectric layers are formed of silicon dioxide or related oxygen-based materials, which generally are called oxides. Silicon nitride forms effective stop layers for oxide dielectric layers since the chemistry is well known to selectively etch oxide over nitride. It is believed that presently available techniques for etching silicon-oxide can be modified for silicon-based low-k dielectrics.

However, one of the most promising of the low-k dielectrics is primarily carbon-based. This preferred material is formed from divinyl siloxane-benzocyclobutene (DVS-BCB), available under the trade name of Cyclotene™ 5021 from Dow Chemical Corporation of Midland, Mich. Its basic constituent includes monomers, as illustrated in FIG. 2, of two groups of benzocyclobutene 30 linked by the silicon-containing divinyl siloxane 32. This is dissolved in an organic solvent, such as mesitylene, in which it forms oligomers, such as the dimer illustrated in FIG. 3. After the solution is spun onto the wafer, it is dried and thermally cured to form a three-dimensional polymer illustrated in FIG. 4, consisting of groups 34 of tetrahydronapthalene. Each napthalene group 34 is linked on one end to another napthalene group 34 and on the other end to yet another napthalene group 34 and to one side of a siloxane group 36. The cured polymer of DVS-BCB is often simply referred to as BCB. Because of the multiple branching, it forms a 3-dimensional polymer. It has the advantage that, after the solvent has evaporated, no volatile byproducts evolve during curing. Further, no catalyst is required for polymerization. The polymer includes about 4% by weight of silicon, the remainder of the polymer being carbonaceous, mostly carbon and hydrogen with a little oxygen. It is believed that the small amount of silicon promotes the adhesion of the BCB to silica and other silicon-based materials commonly found in integrated circuits.

The use of BCB and other carbon-based dielectric materials introduces a question about the precision etching required of all inter-level dielectric layers in advanced integrated circuits. Advanced etching relies upon dry plasma etching. While techniques are well advanced for plasma etching silicon dioxide and silicon nitride, the etching of carbon-based materials, such as carbon polymers, is much less advanced. Nonetheless, low-k materials are being considered for very advanced structures, and it is greatly desired that etch processes be found which have capabilities similar to those for oxide and nitride etching. Cheung et al. in U.S. Pat. No. 5,679,608 disclose the use of BCB as a dielectric layer but do not provide any guidance on its etching.

Dow in their sales brochure "Cyclotene 5021: Integrated Circuit Dielectric Systems: Processing Procedures", 1996 recommends several combinations of etching gases for etching BCB, such as $SF_6/O_2$, $CHF_3/O_2$, and $CF_4/O_2$, with or without an argon diluent and with moderate bias voltages of less than 200V. The fluorine component is recommended to etch the silicon fraction.

Lii et al. provide more process information for etching BCB with $O_2/CF_4$ in "Low dielectric Dow Cyclotene 3022 (BCB) etch for multilevel interconnection integration," *Proceedings of Fifth International Symposium on Ultra Large Scale Integration Science and Technology*, Reno, Nev. May 23–26, 1995, Electrochemical Society Proceedings, vol. 95-5, 1995, pp. 266–274. Flanner et al. have also disclosed a method of etching BCB in "Etching characteristics of the low dielectric constant material Cyclotene*5021 (BCB) in the LAM TCP 9100 Etcher," 1998 *Proceedings Fourth International Dielectrics for ULSI Multilevel Interconnection Conference (DUMIC)*, Feb. 16–17, 1998, Santa Clara, Calif., DUMIC Catalog No. 98IMIC-333D, pp.61–64. Their etching method is directed to a dual damascene structure. It includes the chemical vapor deposition of a silica hard mask from silane. The hard mask is etched with $C_2F_6/C_4F_8/Ar$, and the BCB is etched with $O_2/C_2F_6/Ar$. They suggest that the addition of $N_2$ lessens faceting of the hard mask but increases the bowing of the BCB.

It is greatly desired to use low-k dielectric materials in the dual-damascene structure of FIG. 1. Lii et al., ibid, disclose the formation of a damascene structure similar to that of FIG. 1 using BCB dielectric. However, they perform separate steps of depositing the BCB and etching it both for the via and for the trench. They also deposit the metal separately into the via and the trench with two CMP steps. That is, they use two single-damascene steps. It is desired to reduce the number of etching steps as well as CMP steps.

Yu in U.S. patent application, Ser. No. 09/069,568, filed Apr. 29, 1998, discloses a method of plasma etching BCB using an etching gas containing a combination of $O_2$, $N_2$, and Ar. The nitrogen is ascribed to improving anisotropic etching of the holes by forming a polymer on the sidewalls. She also has found that etch rates are increased by maintaining the wafer at a temperature of about 15 to 20° C.

The use of photoresist by itself to mask the BCB etch is generally insufficient since photoresist is usually a carbon-based material, and it is expected that the etch selectivity between photoresist and the carbon-based low-k material will be poor. As a result, it is known to use hard mask of silicon oxide or silicon nitride, for example, as disclosed by Flanner et al., ibid. That is, a hard mask layer is deposited over the BCB and is photolithographically patterned.

The etching of the carbon-based material must satisfy the typical requirements for via etching, for example, etching of holes of high aspect ratio without etch stop and with vertical sidewalls.

SUMMARY OF THE INVENTION

One aspect of the invention includes plasma etching a carbon-based material with an etching gas including a fluorocarbon gas, an oxygen-containing gas, such as oxygen, and nitrogen. A preferred carbon-based low-k dielectric is divinyl siloxane-benzocyclobutene (BCB), containing about 4% silicon.

With this chemistry, the chamber pressure is kept low, preferably below 18 milliTorr, more preferably below 10 milliTorr, and most preferably below 5 milliTorr.

Also with this chemistry the cathode temperature is preferably maintained at least as low as 0° C.

Preferably, the amount of fluorocarbon is substantially less than the oxygen and the nitrogen.

Preferably the oxygen-to-nitrogen flow ratio should be between 1:1 to 1:3.

Another aspect of the invention includes a dual-damascene etch in which the two dielectric layers are composed of a carbon-based dielectric, the lower stop layer is composed of silicon nitride, and the hard mask and possibly the upper stop layer are composed of silicon oxide. A preferred fluorocarbon for this structure is difluoroethane ($CH_2F_2$). Preferably octafluorocyclobutane ($C_4F_8$) is combined with the difluoroethane. For reduced hard mask faceting, the fluorocarbon flow should be kept low but sufficient enough to etch the silicon component of the carbon-based material.

Yet another aspect of the invention includes plasma etching a carbon-based layer overlaid with a hard mask layer and a patterned organic photoresist layer. The hard mask layer may be composed of silicon oxide. The etching is performed in a plasma reactor having a pedestal cathode that is RF biased and having a separately powered plasma source region, such as is provided by an RF inductive coil. The bias power provides the principal means of controlling the etching of the carbon-based layer. The RF bias applied to the cathode is set to a low value, especially when the photoresist has cleared.

A yet further aspect of the invention includes decreasing the amount of supplied oxygen when the photoresist has cleared and the hard mask is exposed. A monitor may detect the photoresist clearing.

In a yet further aspect of the invention for etching a silicon-free carbon-based dielectric, only oxygen and nitrogen may be used in relative amounts between one and three.

DETAILED DESCRIPTION OF THE PREFERRED EMBODIMENTS

We have discovered an etching process useful for etching complex structures in carbon-based dielectric materials, particularly those exhibiting low dielectric constant. The process is particularly useful for dual-damascene inter-level metallization.

Figure 5:
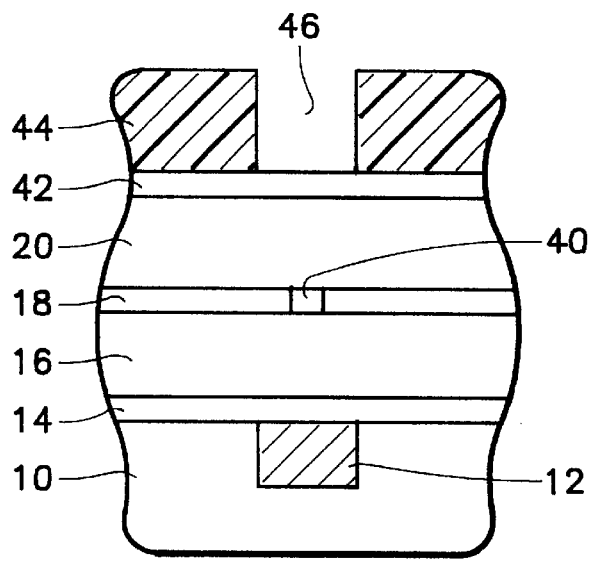
FIG. 5 is a cross-sectional view of the a partially completed dual-damascene structure advantageously using the process of the invention for etching carbon-based dielectrics.

In one preferred embodiment of the invention utilizing the self-aligned dual-damascene process, the structure just prior to the etch process is illustrated in cross-section in FIG. 5. The structure includes a copper metallization 12 formed in the surface of a substrate 10. In the self-aligned technique, the substrate 10 and the metallization 12 are then covered with a lower stop layer 14, a low-k lower dielectric layer 16, and an upper stop layer 18. In this embodiment, the low-k dielectric layer 16 is composed of the carbon-based material BCB, the polymerized product of the divinylsiloxane-benzocyclobutene discussed above, and the stop layers 14, 18 are composed of silicon nitride, nominally of composition $Si_3N_4$ and hereafter referred to as nitride. The silicon nitride has a more general composition $SiN_x$, where x can range from about 1 to 1.5. The upper stop layer 18 is preferably composed of silicon oxide because its dielectric constant is much lower than that of nitride, thereby decreasing the resulting total capacitance of the whole dielectric structure 14, 16, 18, 20. The lower stop layer 14 is preferably made of silicon nitride because it presents an excellent barrier against the diffusion of copper from the metallization 12. The BCB dielectric layers have exemplary thickness of 500 nm, and the nitride stop layers 14, 18 have exemplary thicknesses of 50 to 100 nm.

After the formation of the lower BCB layer 16 and the two nitride stop layers 14, 18, the upper oxide stop layer 18 is photolithographically patterned to form a via mask aperture 40 over the area of the intended via. This etch is not critical and requires no selectivity to the BCB, but the usual etch oxide etch chemistry contains no oxygen so that selectivity to BCB is in fact high. A low-k upper dielectric layer 20 of BCB is then formed over the patterned upper oxide stop layer 18, and it may fill the via mask aperture 40 but need not. A hard mask layer 42 is deposited over the upper dielectric layer 20. In the experimental examples, the hard mask layer 42 was composed of silicon dioxide having a thickness of about 0.2 μm grown by plasma-enhanced chemical vapor deposition (PECVD) using tetraethylorthosilicate (TEOS) as the principal precursor gas. The hard mask is considered necessary because photoresist like BCB is an organic material and no etch chemistry has been found providing a high etch selectivity of BCB to photoresist. A photoresist layer 44 is then spun on and photographically processed to form a trench mask aperture 46.

Figure 6:
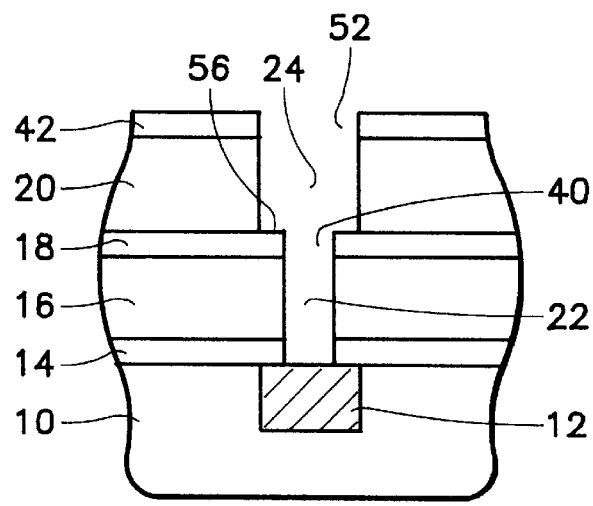
FIG. 6 is a cross-sectional view of the completed dual-damascene structure of FIG. 5.
Figure 7:
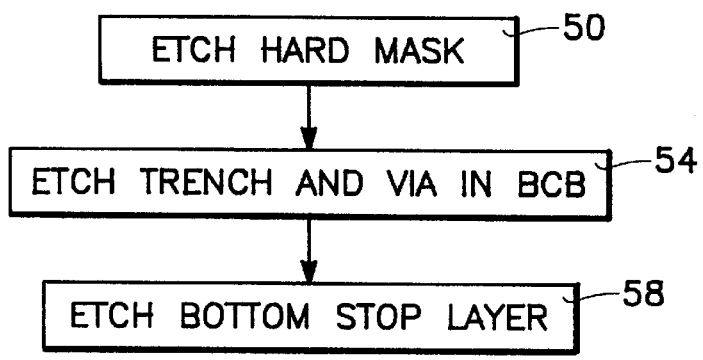
FIG. 7 is a process flow diagram illustrating the major steps in etching the dual damascene structure.

An integrated etch process, illustrated in the flow diagram of FIG. 7, is then performed on the structure of FIG. 5 to produce the structure of FIG. 6. In a hard-mask etch step 50, the hard mask 42 is etched to produce a trench mask aperture 52. It is preferred that the mask etch be at least somewhat selective to the underlying BCB. In a BCB etch step 54, an essentially continuous etch anisotropically etches through the upper and lower BCB layers 20, 16, which are linked by the via mask aperture 40. However, as will be described later, it may be preferred to somewhat vary the etching conditions between the etching of the shallow, wide trench 24 and that of the deep, narrow via hole 22. It is important that the BCB etch step 54 be selective to both the upper and lower stop layers 18, 14. The selectivity to the upper stop layer 18 prevents the exposed trench floor 56 from being significantly deepened and the dimension of the via 22 changed from its original size during the long etch of the lower BCB layer 16. In a sense, the lower stop level 18 acts as a hard mask for etching the via 22. The selectivity to the lower stop layer 14 allows the energetic BCB etch to stop on the lower stop layer 14 with no danger of the underlying copper line 12 being sputtered. Sputtering of copper occurring under strong etching conditions distributes the copper to other parts of the integrated circuit, which degrades reliability.

The BCB etch completes the formation of the trench 24 and most of the via hole 22, which is still underlaid by the lower stop layer 14. In a final plasma treatment step 58, the lower stop layer 14 at the bottom of the via hole 22 is removed to produce the structure of FIG. 6 in which the lower copper interconnect 12 is exposed. The plasma treatment step 58 is generally a soft etch so that copper sputtering is not significant, and selectivity over exposed metal is easily achieved by operating at a low bias. This step may remove the portion of the upper stop layer 18 exposed at the trench floor 56, but this is not critical one way or the other.

The above description of the integrated process is somewhat general. Hung et al. have provided more details in U.S. patent application, Ser. No. 09/112,094, filed Jul. 9, 1998, although the cathode temperatures reported there should be −10° C.

Figure 1:
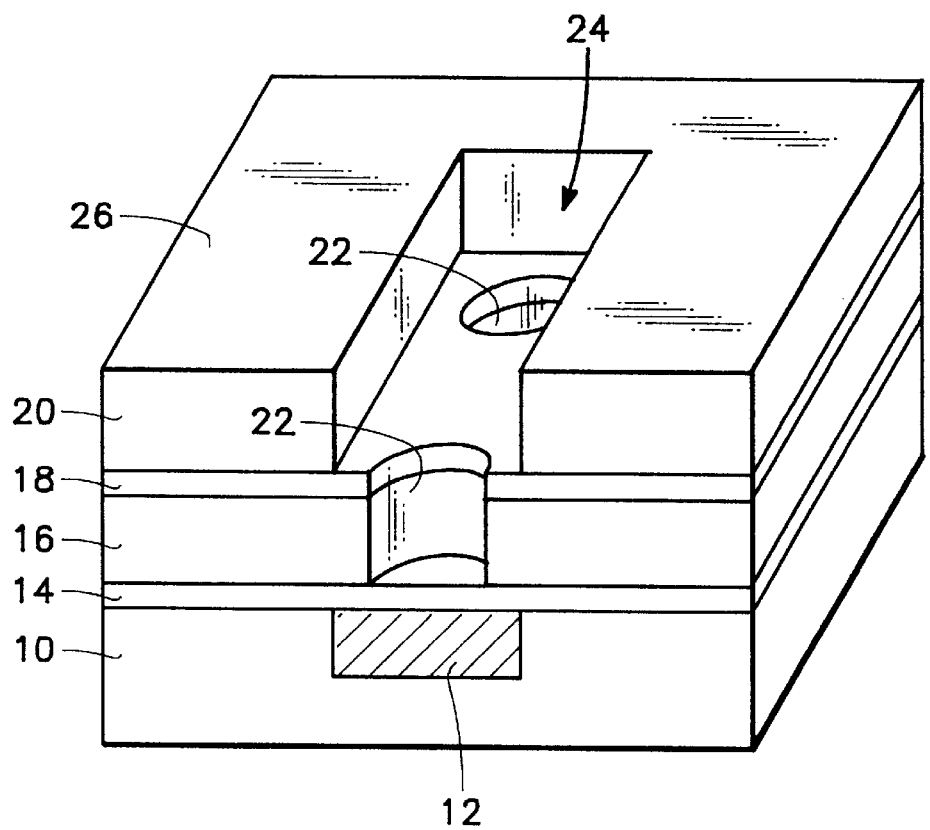
FIG. 1 is a isometric view, partially in cross section of a dual-damascene structure in a semiconductor integrated circuit.
Figure 2:
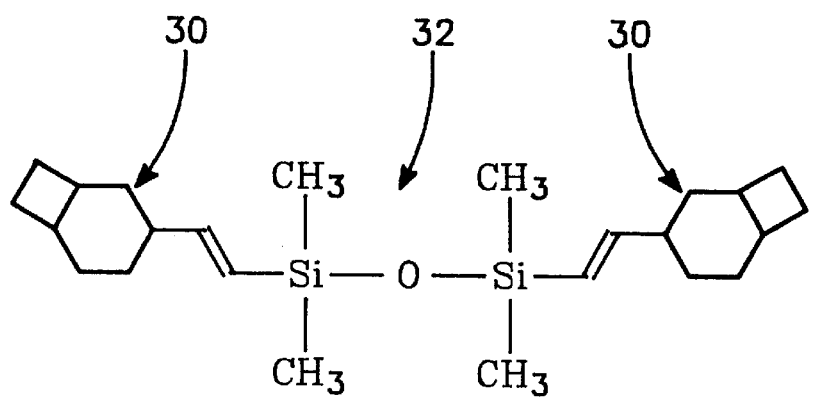
FIGS. 2–4 are chemical structures showing the polymerization of BCB, a carbon-based low-k dielectric material.
Figure 3:
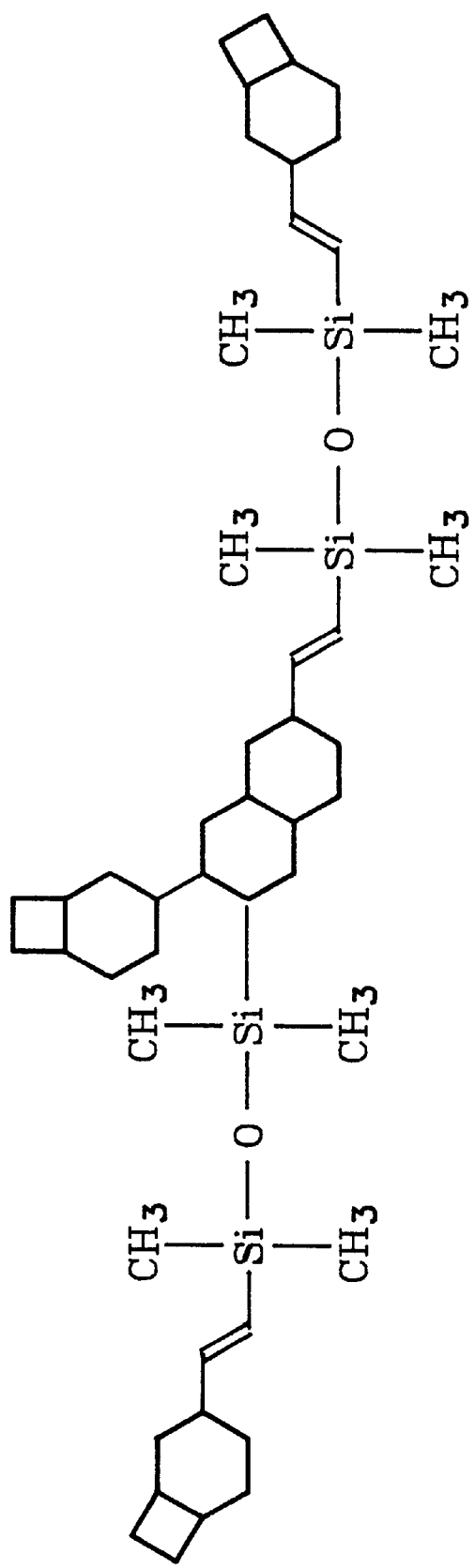
Figure 4:
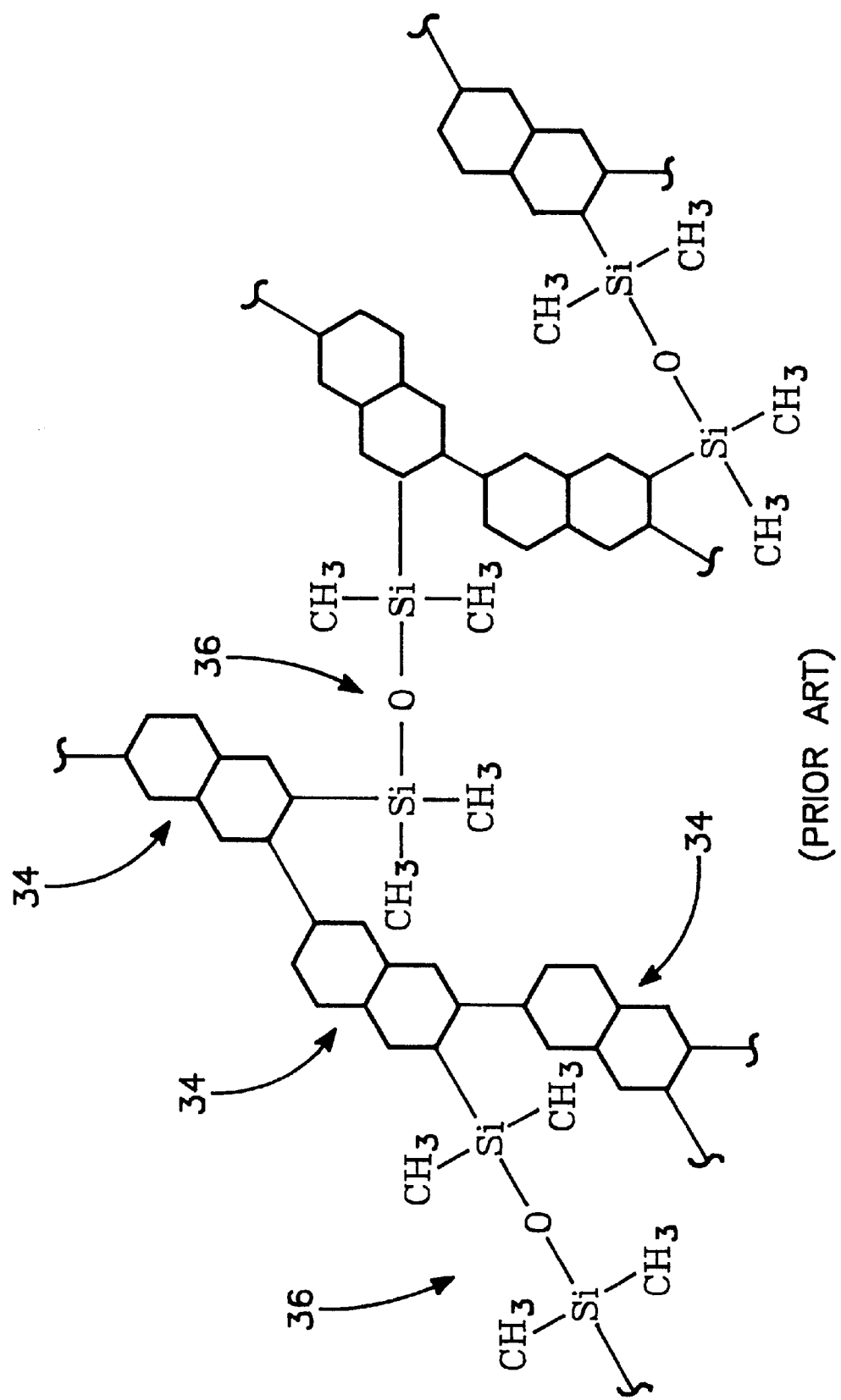

As discussed previously, following formation of the dual-damascene structure of FIGS. 1 and 6, the trench 24 and via hole 22 are filled and overfilled with a metal such as copper. Then, chemical mechanical polishing removes the metal rising above the top of the trench 24.

It is advantageous to perform all the damascene etch steps in a single reactor under somewhat similar conditions. The critical steps are preferably (though thought not necessarily) performed in a high-density plasma, which is defined as a plasma filling all the space it occupies, with the exception of the plasma sheath, and having an average ionization density of at least $10^{11}$ cm$^{-3}$. The high-density plasma has the advantage of a high ionization fraction of the etching species allowing deep penetration into a narrow and deep hole, of a fast etch rate, and the ability in the usual configuration of decoupling the plasma source power from the bias power. The IPS (Inductive Plasma Source) etch reactor is such a reactor that can both generate the desired high-density plasma and can operate over a wide range of conditions. It is available from Applied Materials, Inc. of Santa Clara, Calif. and is described by Collins et al. in U.S. patent aplication, Ser. No. 08/733,544, filed Oct. 21, 1996 and in European Patent Publication EP-840,365-A2.

Figure 8:
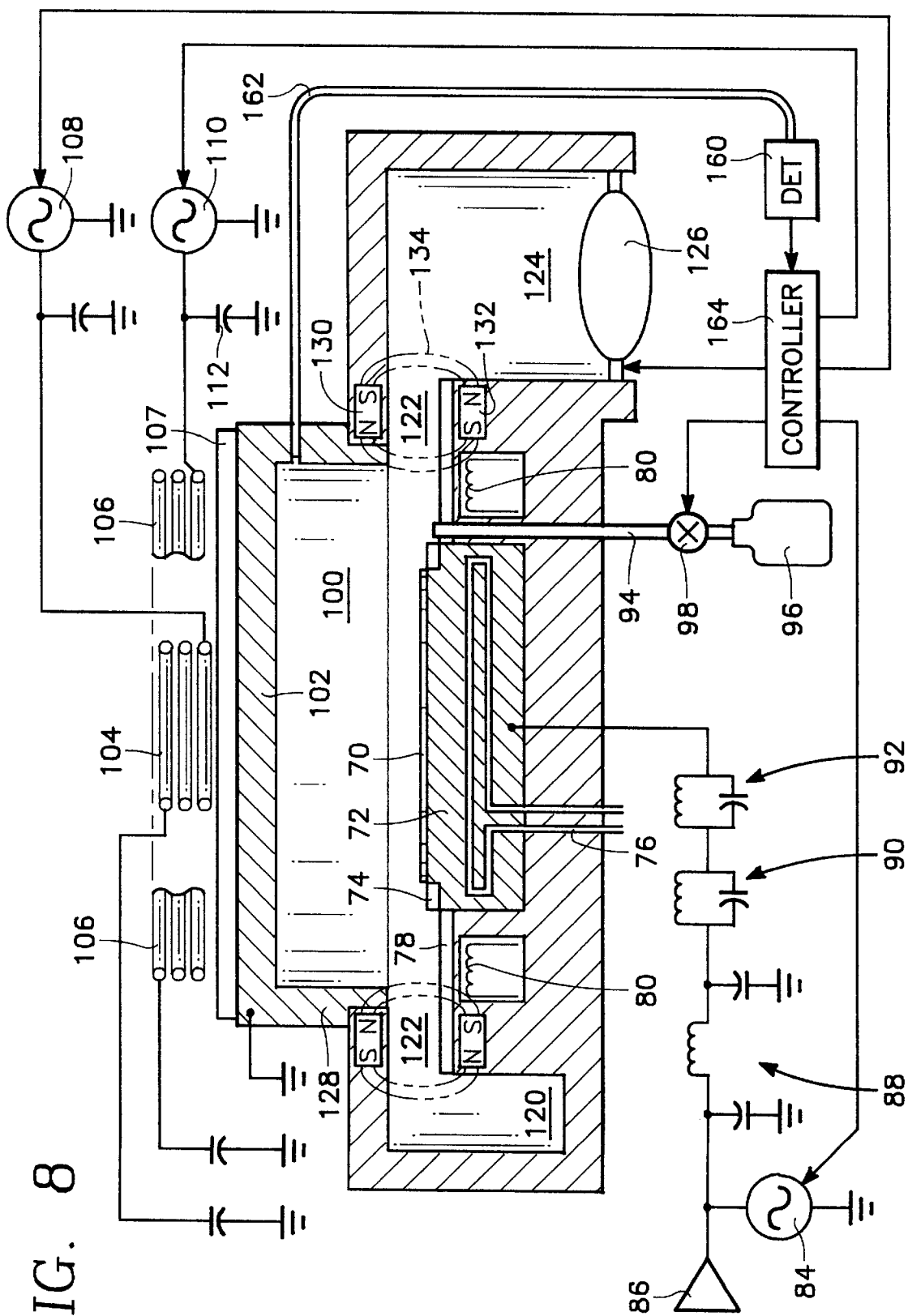
FIG. 8 is a schematic illustration of an inductively coupled high-density plasma reactor in which the invention is advantageously practiced.

One version of the IPS reactor is illustrated schematically in FIG. 8. A wafer 70 is supported on a pedestal 72 operating as a cathode electrode and including an electrostatic chuck and a protective edge ring 74. A liquid cooling channel 76 passes through the pedestal 72, and an unillustrated chiller supplies cooling liquid to the cooling channel 76 to cool the pedestal 72 and attached wafer 70 to a predetermined temperature. A thermal transfer gas, such as helium, is maintained between the wafer 70 and the pedestal 72 to provide thermal conduction between the two. The temperature of the wafer 70 can be controlled by not only adjusting the chiller temperature but also by adjusting the backside gas pressure.

A silicon ring 78 surrounds the pedestal 72 and is controllably heated by a ring of lamps 80. Hot silicon can scavenge free fluorine from a plasma. A first RF power supply 84 and a electrostatic chuck driver and filter 86 are electrically connected to the pedestal 72 through a fixed bias network 88, a harmonic isolation filter 90, and a DC bypass choke circuit 92. Thus, the RF biased pedestal 72 acts as a cathode in opposition to the grounded silicon window 102 and grounded aluminum chamber wall. The first RF power supply 84, preferably operating at 1.6 MHz, supplies bias power to the pedestal electrode 72 while the electrostatic chuck driver and filter 86, essentially operating at DC, selectively chucks the wafer 70 to the electrostatic chuck. A lower gas feed 94 penetrates the silicon ring 78 and supplies gas mixture from several gas sources 96 through a bank of mass flow controllers 98 to a processing region 100 over the pedestal 72.

A polysilicon window 102 is disposed in opposition to the pedestal 72. Its thickness and semiconductor doping level are chosen so that it both can be electrically grounded to act as an anode electrode and can pass generally axial RF magnetic fields generated by inner and outer inductive coils 104, 106 positioned behind the window 102. A thermal control plate 107 coupled to the back of window 102 and below the coils 104, 106 controls the temperature of the silicon window 102 by a combination of chilled water and radiant bulbs. The inner and outer coils 104, 106 are powered respectively by second and third RF power supplies 108, 110, preferably operating at 2.3 and 2.0 MHz respectively. The RF power supplies 108, 110 are connected to respective first ends of the coils 104, 106 and tuning and loading capacitors 112 are connected between the first and second ends of the coils 104, 106 and ground. The RF power supplied to the coils 108, 110 in such proportions as to provide a more uniform plasma is inductively coupled into the source region of the processing space 100 between the pedestal 72 and the window 102. The amount of power is primarily responsible for the density or strength of the plasma. The power supplied to the pedestal 72 is capacitively coupled into the plasma adjacent to the principal surface of the wafer 70 and is responsible for the amount of DC bias of the plasma relative to the wafer. The DC bias determines the energy of ions extracted from the plasma across the sheath adjacent to the wafer 70 and thus determines the energy of ions striking the wafer. High-energy ions effectively sputter, while lower-energy ions and neutral radicals striking the wafer from the plasma tend to participate in more of a chemical reaction.

An annular pumping channel 120 surrounds the processing region 100 and is connected to it through an annular flow constriction 122. An unillustrated 2000 liter/s turbo vacuum pump is connected through a manifold 124 to the pumping channel 120 to pump the processing region 100 through the constriction 122. An adjustable throttle valve 126 between the manifold 124 and the turbo pump controls the chamber pressure within the chamber defined generally by the pedestal 72, the silicon ring 78, the polysilicon window 102, and an electrically connected chamber wall 128. Two ring magnets 130, 132 are positioned respectively above and below the constriction 122 to the pumping channel 120. Both magnets 130, 132 have an inner annular portion of one magnetic pole and an outer portion of the other magnetic pole. However, the pole orientations are reversed between the two magnets 130, 132 so that they induce a generally toroidal static magnet field 134 in the area of the flow constriction 122. This magnetic field acts to confine the plasma to within the processing region 100 and to exclude it from the pumping channel 120.

The IPS chamber can be operated with a high-density or a low-density plasma. The temperature of the silicon surfaces and of the wafer can be controlled. The bias power applied to the cathode 72 can be adjusted independently of the source power applied to the coils 104, 106.

Returning now to the process of FIG. 7, the hard-mask etch 50 may use conventional oxide etch processes developed for inter-level oxide via etches, for example, using $C_4F_8$/Ar or $C_2F_6$/Ar or $C_4F_8$/$C_2F_6$/Ar with heated silicon providing fluorine scavenging.

The BCB etch step 54 is believed to be the most critical one. We have achieved a satisfactory etch using an oxygen-containing gas such as the conventional $O_2$ as the principal etchant for the carbon-based BCB. However, since BCB contains a small amount of silicon, the etch rate is substantially increased by the inclusion of a substantially smaller amount of a fluorocarbon, such as $C_4F_8$. We have found that without any fluorocarbon a residue develops at the bottom of the etched hole, presumably including silicon. But, the amount of the fluorocarbon should be minimized to reduce etching of the silica hard mask, which is usually manifested by faceting of the upper corners of the patterned hard mask.

Several different oxygen-containing gases were tested. Pure oxygen ($O_2$) provides no sidewall protection. Carbon dioxide ($CO_2$) provides some sidewall protection, but it reduces the BCB etch rate. When the bias power is reduced to reduce the hard mask faceting, $CO_2$ tends to form some type of photoresist residue on top of the hard mask as well as some residue on the sidewalls. Carbon monoxide (CO) provides significant passivation of the sidewalls, even to the extent of a tapered etch producing a trench or via smaller at its bottom than top. Carbon monoxide like carbon dioxide increases the hard mask faceting and probably forms similar residues with low-energy ions.

Any oversupply of oxygen results in undercut of varying degree. The recipe should be adjusted to reduce the oxygen to the regime of a transport limited reaction. That is, a reaction in which all the supplied oxygen is consumed in an anisotropic etch process maintained by directing the oxygen ions in the vertical direction by control of the ion energy through the bias power. All oxygen ions and radicals that are not consumed in the etch at the bottom of the profile are available for deleterious isotropic etching. Any sidewall passivation provided by the fluorocarbon and nitrogen is inhibited by isotropic oxygen etching.

Figure 9:
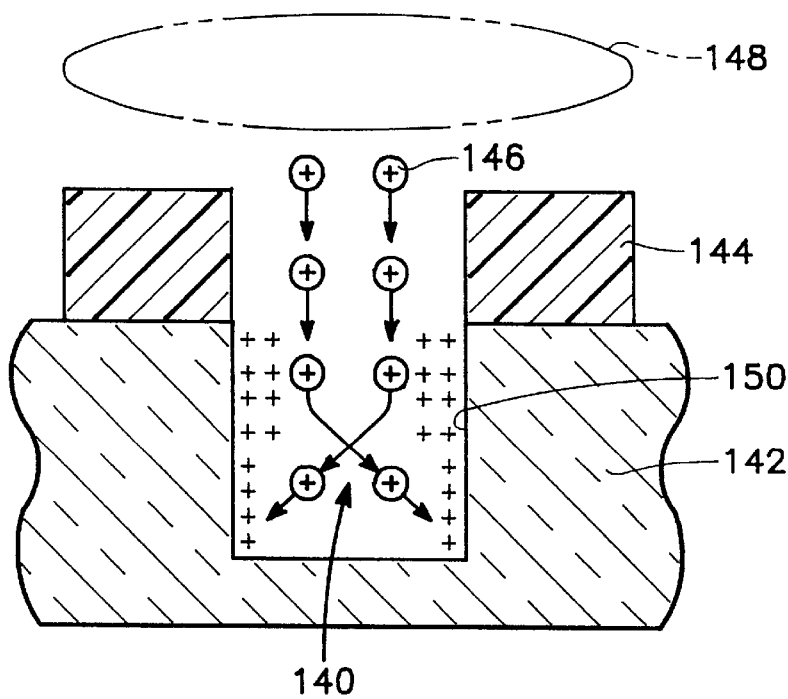
FIG. 9 is a schematic representation of a mechanism explaining the effect of nitrogen on via bowing.

The inclusion of a substantial amount of $N_2$ has been found to prevent retrograde etching or bowing and to produce a nearly vertical etch through the BCB. Without the nitrogen, the holes etched in BCB tend to be wider at the bottom than at the top. We believe the reason for the bowing can be explained with reference to FIG. 9 in which a hole 140 in an insulating BCB substrate 142 is defined by a photoresist mask 144. As is known for a plasma etcher, positive ions 146 are accelerated across the sheath of a plasma 148 into the developing hole. We believe the mechanism for bowing arises from the fact that the positive ions 146 tend to stick to and become immobile on the etched sidewalls 150 of the electrically insulating BCB 142. Therefore, the stuck positive ions will not recombine with the negatively charged wafer surface. The negative surface charge arises in asymmetric plasma etchers in which a RF-powered cathode develops a negative charge in producing DC self-biasing. However, the positive charge buildup of the sidewall 150 is greater at the top of the hole 140 since the top has been longer exposed to the plasma. When the positive ions 146 are accelerated from the high-density plasma and enter the hole 146 close to one of its sidewalls 150, they will be laterally repelled by the strong charge and thus redirected towards the opposite wall at the bottom of the hole 140. The ions will be slowed down by the charge built up at the bottom, but the bottom charge will be weaker. As a result, it is likely that many more ions 146 will strike the bottom sidewall than the top sidewall. Because etching of BCB requires much less sputtering energy compared to silicon oxide, those redirected ions are sufficient to significantly etch the bottom sidewalls of the developing hole 140. That is, the hole 140 will bow or flare.

It is believed that the addition of $N_2$ to the plasma evens out the sidewall charge distribution because elemental nitrogen is both electro-negative as well as electro-positive (easily forms both positive and negative ions). A more even distribution of sidewall charge decreases the bowing effect described above.

Another possible explanation is that the nitrogen promotes the formation of a passivating polymer on the side walls. What is experimentally known is that under low bias conditions and without $N_2$ the hole flares at the bottom, with some $N_2$ a nearly vertical profile is obtained, and with even more $N_2$ a tapered etch is obtained which is narrower at the bottom.

Nitrogen also participates directly in the BCB etching since dissociated nitrogen radicals combine with carbon in BCB to form volatile CN. The plasma source power should be kept high to produce a high-density plasma and increase the etch rate. Increasing bias power also increases the etch rate, but the bias power should nonetheless be kept low in order to reduce faceting of the silica hard mask if the hard mask is exposed after the photoresist has been cleared.

The chamber pressure should be kept low to provide better verticality in the etched carbon-based material, for example, below 5 Torr.

The wafer temperature should be kept low, below about 0° C. so as to increase the BCB etch rate.

A base recipe has been established for a test structure consisting of a silicon wafer overlaid with 1 $\mu$m-thick layer of BCB covered by a 0.2 $\mu$m-thick hard mask of TEOS silica. For the tests establishing the via etch, the BCB was underlaid with a layer of silicon nitride $SiN_x$. Different apertures in the hard mask are felt to adequately model the different parts of the critical BCB etch in the dual-damascene process, that is, both etching the wide trench overlaid with photoresist and etching the narrow via with the photoresist having cleared. The recipe is summarized in TABLE 1. The labeling as to trench and via etch is not completely accurate. The transition from the first step to the second step should occur when the photoresist has cleared, not necessarily when the etching enters the narrower via, in order to compensate for the photoresist loading effect.

TABLE 1

|  | (Trench) Etch Step 1 | (Via) Etch Step 2 |
| --- | --- | --- |
| $O_2$ Flow (sccm) | 30 | 22 |
| $C_4F_8$ Flow (sccm) | 3 | 3 |
| $N_2$ Flow (sccm) | 45 | 45 |
| Outer Source Power (W) | 1000 | 1000 |
| Inner Source Power (W) | 250 | 250 |
| Bias Power (W) | 250 | 250 |
| Pressure (mT) | 3–5 | 3–5 |
| Roof Temp. (° C.) | 200 | 200 |
| Ring Temp. (° C.) | 270 | 270 |
| Cathode Temp. (° C.) | −10 | −10 |
| Backside He Pressure (T) | 10 | 10 |

This recipe for the trench etch produces an average etch rate for BCB of about 900 nm/min. The BCB etch is anisotropic, the variation of a critical dimension (CD) of 0.35 $\mu$m being +0.025 $\mu$m. The etch profile is controlled within the range of 88 to 90° without bowing. The corner of the silica hard mask suffers some faceting, but it is acceptable.

The recipe changes somewhat between the etching of the trench and that of the via, specifically, a reduction in the amount of $O_2$. This recipe for the via etch produces an average BCB etch rate of about 857 nm/min. The etch anisotropy and profile are about the same as for the trench etch. The etch rate nonuniformity is about 2.6%. The selectivity of the BCB etch to $SiN_x$ is about 35:1. Hard mask faceting is clearly present. Neither recipe produces visible residues in the etched hole because of the lean chemistry.

The reduction in $O_2$ from the first step to the second step is primarily driven by the photoresist having been consumed during the trench etch. Etching organic photoresist, just as in etching organic BCB, consumes oxygen as the carbon combines with oxygen to evolve as CO. When the photoresist has been consumed, a higher fraction of the supplied oxygen is available for etching the BCB. Hence, the amount of supplied oxygen is reduced but the amount available for BCB etching remains the same so that the effective ratios of $O_2$:$C_4F_8$:$N_2$ for etching the BCB remain the same. With a thick photoresist, it is possible that the via is halfway etched before the switch to the second step should be made. For these reasons, the two etch steps of TABLE 1 are not properly classified as trench and via steps but are distinguished primarily by the presence or absence of photoresist.

The recipe of TABLE 1 is advantageously modified by replacing the flow of $C_4F_8$ with 6 sccm of $CH_2F_2$, all other process parameters being kept the same. Difluoromethane is a more heavily polymerizing fluorocarbon and provides more sidewall protection while the $C_4F_8$ preferentially polymerizes on the floor of the hole, thus better protecting the under layer. The recipe with $CH_2F_2$ shows reduced faceting of the hard mask and less undercut.

The silicon is heated during the BCB etch because the BCB etch needs to be integrated with other etch steps, such as the hard mask opening and the etching of the bottom nitride layer which need to be highly selective to nitride, thus prompting the silicon scavenging. For a stand alone BCB etch, no heated silicon is required, but the process parameters may need to be reoptimized.

Several experiments have been performed to establish the process windows and trends in the variation of the process parameters.

A two-level Design of Experiment (DOE) was performed to study the effect of the $O_2$:$C_4F_8$ ratio and the cathode temperature upon the BCB etch rate and the CD control. In a DOE, a baseline experiment is performed, and then all the varied parameters (two for a two-level DOE) are varied first in one direction and then in the other. The directions of parameter variations are grouped to produce effects that are anticipated to add rather than cancel each other. The three sets of varied parameters are given in TABLE 2, where the baseline conditions were used in run #2.

TABLE 2

| Run | $O_2$:$C_4F_8$ Ratio | Cathode Temp. (° C.) |
| --- | --- | --- |
| 1 | 6 | 0 |
| 2 | 8 | 2 |
| 3 | 10 | 5 |

Figure 10:
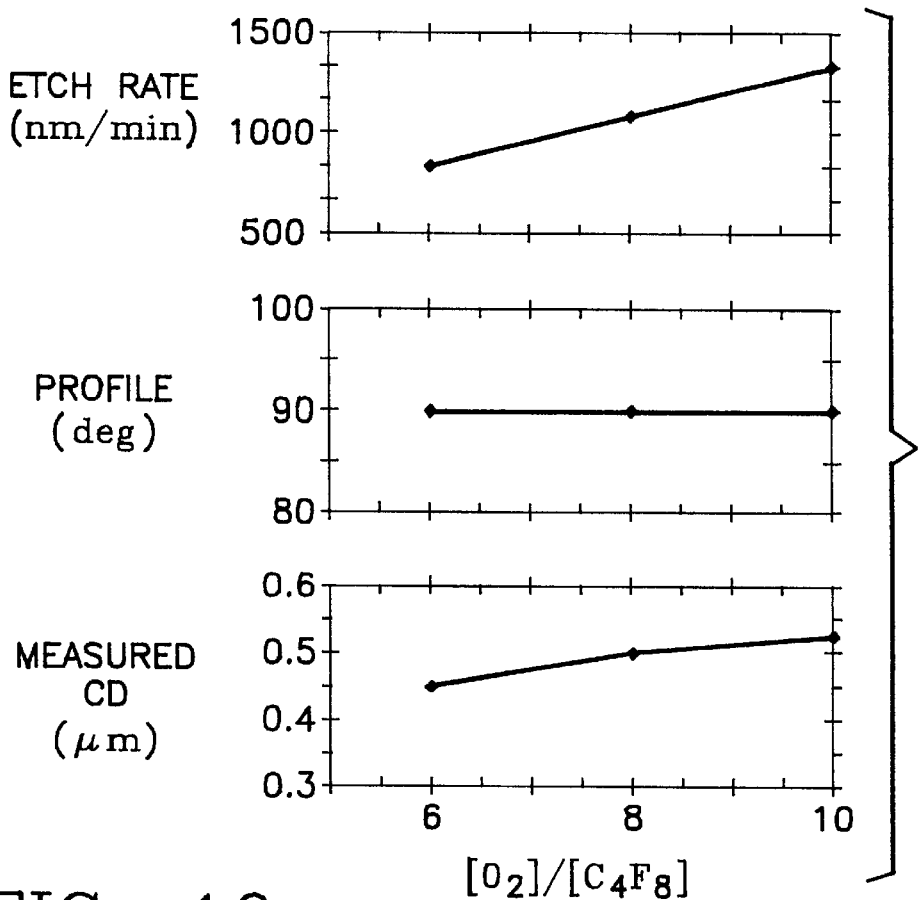
FIG. 10 is a graph showing the results of a two-level DOE for variations in the ratio of oxygen to fluorocarbon and the cathode temperature.

The results are graphed in FIG. 10 for the $O_2$:$C_4F_8$ variation. The results from varying the cathode temperature did not show such large variations in etching characteristics. According to FIG. 10, the BCB etch rate increases with increasing oxygen, and the critical dimension increases with oxygen. The etch profile shows little dependence upon the oxygen-to-fluorocarbon ratio.

Figure 11:
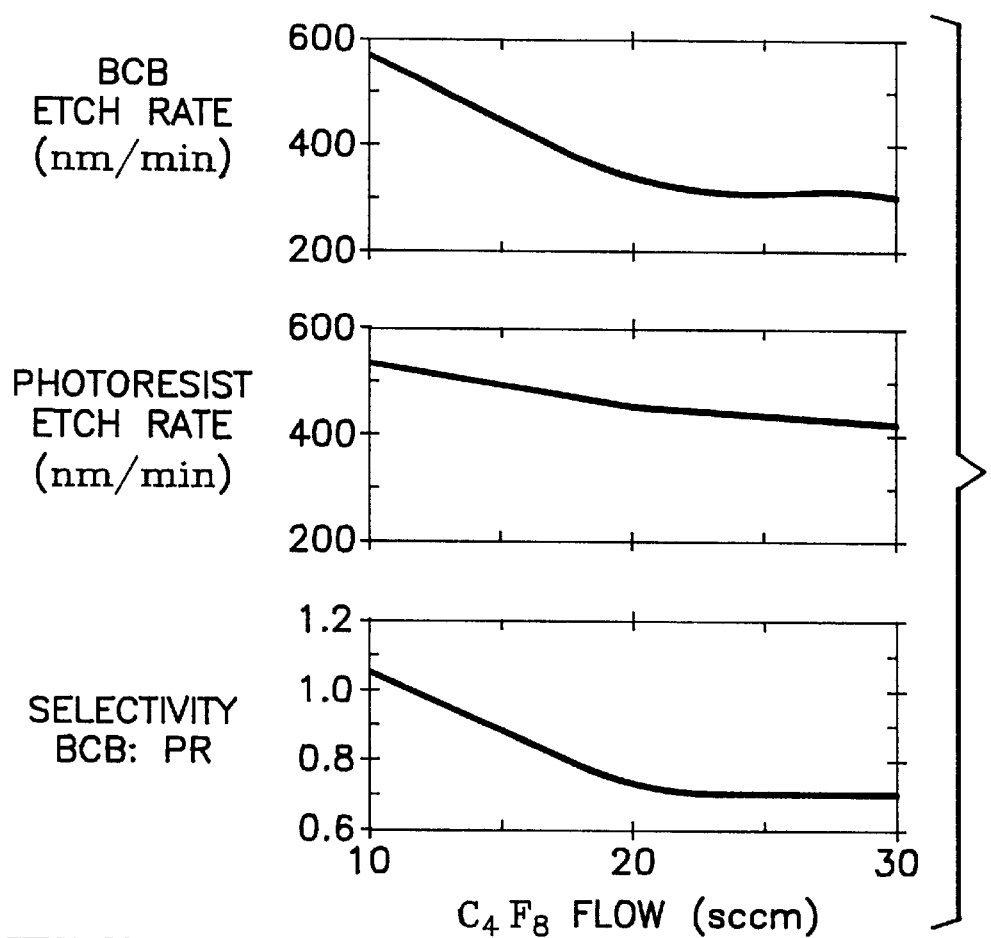
FIG. 11 is a graph showing the effect of the fluorocarbon flow rate on the BCB and photoresist etch rates and the resulting selectively of BCB over photoresist.

Higher flows of fluorocarbon relative to oxygen are thus shown to decrease the BCB etch rate. More complete data is plotted in FIG. 11 for the variation of the BCB and photoresist etch rates and the resulting selectivity of BCB over photoresist as a function of the $C_4F_8$ flow. A low fluorocarbon flow is clearly preferred. Furthermore, high fluorocarbon flows also increase the etch rate of hard masks or stop layers, thus decreasing the etch selectivity of BCB over these materials. Hence, a lowered fluorocarbon flow is desired, but sornie fluorocarbon is required for the silicon component of BCB.

Figure 12:
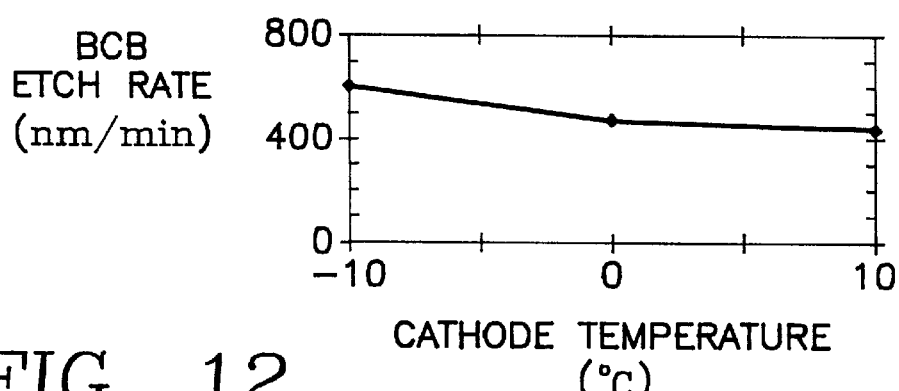
FIG. 12 is a graph showing the effect of cathode temperature on the BCB etch rate.

Another set of experiments was performed comparing the effects of yet lower cathode temperatures. The etch rate and etch profile were observed to be insensitive to variations in with cathode temperatures between −5° C. and −15° C. A yet further set of experiments was performed to measure the dependence of BCB etch rate on the cathode temperature between −10< C. and +10° C. The etch recipe was the same as for the trench etch in TABLE 1except that the $N_2$ flow was reduced to 30 sccm. The results are shown in the graph of FIG. 12, which demonstrate the advantage of maintaining the cathode temperature below 0° C.

A yet further set of experiments was performed in which the fluorocarbon gas was alternately $C_4F_8$ and hexafluoroethane ($C_2F_6$), the amounts of $O_2$ and $N_2$ being held the same. Hexafluoroethane represents a 25% reduction in the amount of F used in etching the 3 to 4% Si in BCB. It is believed that the fluorine removes silicon from the BCB matrix by forming volatile $SiF_4$. If the etching gas lacks fluorine, the BCB etch rate is slow and residues form at the bottom of the etched feature. The experiments show that with the higher fluorine content in $C_4F_8$ per unit flow, the faceting of the hard mask is more severe than with the lower fluorine content of $C_2F_6$ while the $C_4F_8$ results in slight undercutting. The increased faceting with $C_2F_6$ is explainable since fluorine is the main etchant for the oxide of the hard mask, and the decreased undercutting with $C_4F_8$ is also explainable since it has a higher carbon content, providing increased sidewall polymerization and passivation. In general, higher fluorine content increases hard mask faceting (reduced selectivity to oxide), and higher carbon content increases sidewall passivation (reduced undercut).

The bias power has been found to be important in reducing the faceting of the hard mask. A comparison was made between etching with an RF bias power of 250 W and of 450 W. The DC bias measured for these RF bias powers are approximately −200 VDC and −275 VDC respectively. Thus, the lower bias power produces a lower ion energy incident on the wafer, resulting in less species-independent sputtering. At the lower bias power, less faceting of the hard mask is observed, but there is significant profile bowing and undercutting. At the higher bias power, severe hard mask faceting is observed, but the profile bowing is reduced and there is no undercut, presumably both because of the higher fraction of ions and because of the higher amount of by products contributes to sidewall passivation. In general, the flux of etching particles is proportional to the source power while their energy is controlled by the bias power.

A two-level DOE was performed varying the bias power and the combined source power to determine the dependence of the hard mask faceting, measured as a recess, the BCB etch rate, and the profile angle. The DOE parameters are presented in TABLE 3.

TABLE 3

| Run | Bias Power (W) | DC Bias (VDC) | Source Power (W) |
|---|---|---|---|
| 1 | 250 | −200 | 800 |
| 2 | 350 | | 1000 |
| 3 | 450 | −275 | 1200 |

Figure 13:
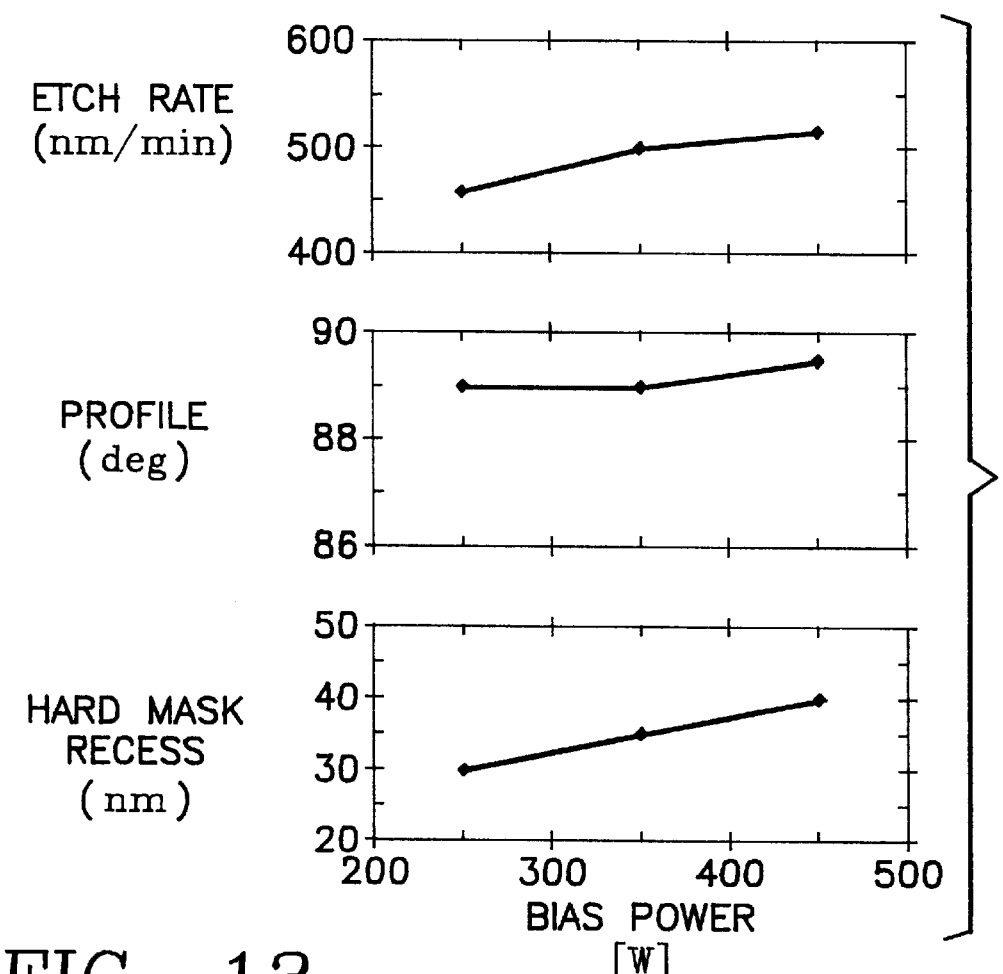
FIGS. 13 and 14 are graphs showing the results of a two-level DOE for variations in the bias power and the combined source power.
Figure 14:
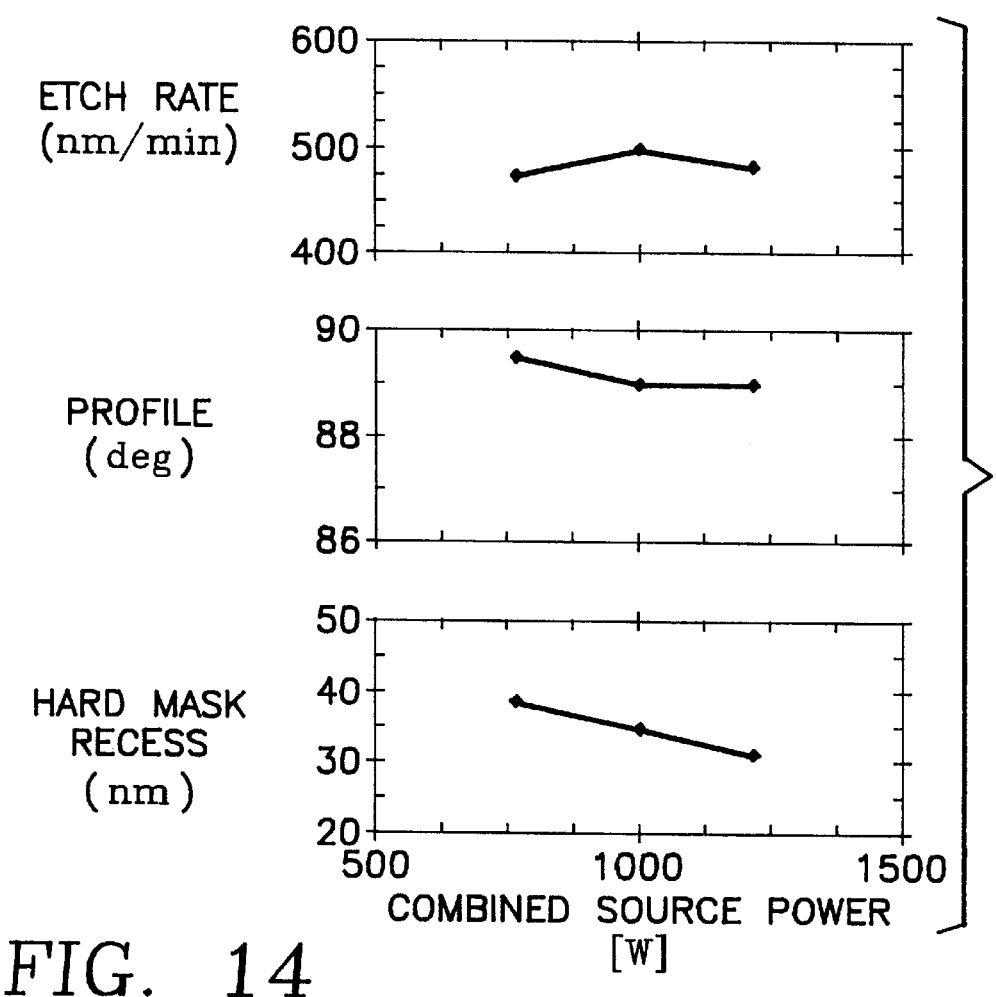

The results are shown for the variation of bias power in FIG. 13 and of the combined source power in FIG. 14. Although increased bias power increases the BCB etch rate and somewhat improves the profile angle, it significantly increases the faceting of the hard mask. On the other hand, an increased source power substantially decreases the hard mask faceting with moderate variations in the BCB etch rate in this power range with only a small decrease in the profile angle. It thus appears that in the tested regime of less than 450 W bias power the etch rate of BCB is not sensitive to the source power level and thus not sensitive to the source ion flux. Reducing DC bias is the key to maintaining the integrity of the hard mask overlying the BCB. We feel that the bias power and secondarily the source power need to be adjusted in etching carbon-based dielectrics to achieve DC self-biasing of between −200 and −300 VDC. In this regime, the ion energy is the dominant factor for sputtering since the source power is already low and the bias power is prime control. This regime is dramatically different from conventional silica etching in which physical sputtering plays a crucial role. Once the sputtering threshold in conventional silica etching has been surpassed, the etching rate varies proportionately with the source power. The etching of carbon-based materials achieved by the invention is more chemical in nature and requires only a slight ion energy. Nonetheless, in this given process regime, bias power emerges as the main control for the BCB etch rate.

Figure 15:
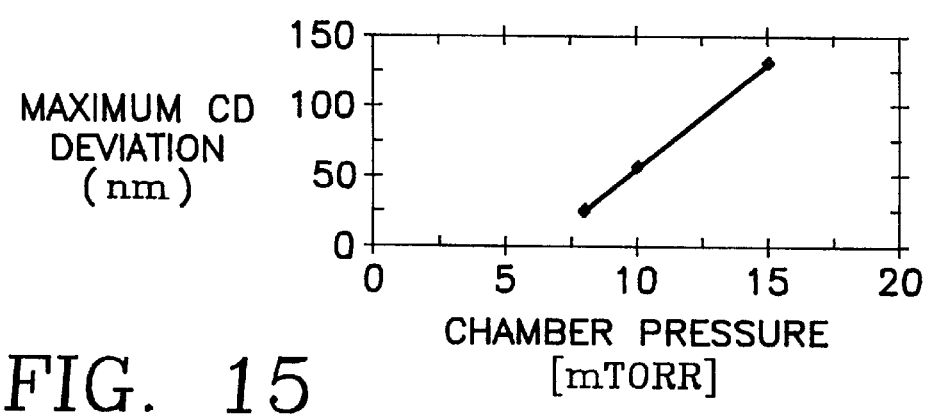
FIG. 15 is a graph showing the effect of chamber pressure upon the maximum variation in the critical dimension.

We have found that chamber pressure is an important control in etching carbon-based dielectric materials. Three samples were etched with respective chamber pressures of 6, 10, and 15 mTorr. The maximum deviations in the critical dimension were measured. As shown in the graph of FIG. 15, the CD deviations markedly increase above 6 mTorr. These deviations occur mostly at the bottom of the etched hole. It is speculated that the effect is due to uneven charges on the sidewalls of the hole, and the higher flux of ions or more isotropic nature of the etch at higher chamber pressures. In any case, lower chamber pressures are preferred for etching of low-k carbon-based dielectrics, a range of 3 to 5 mTorr being most preferred.

Photolithography of BCB is made difficult because of the organic character of both BCB and the commonly used photoresists. The selectivity of the BCB etch relative to photoresist should be kept as high as practicable, although selectivity values around 1 are expected. Experimentally it has been determined that variations of the chamber pressure between 5 and 15 mTorr and of the total source power between 900 and 1600 W have little effect upon the photoresist selectivity, the observed values being around 0.90. However, the choice of etching gas has a significant effect. Three fluorocarbon etching gases were tested, $C_4F_8$, $CHF_3$, and $CH_2F_2$, of which $C_4F_8$ is the most polymerizing in terms of bottom protection, $CH_2F_2$ is the most polymerizing in terms of sidewall passivation and selectivity to photoresist, and $CHF_3$ is considered the least polymerizing. As a general rule, polymerizing increases with the number of carbon atoms and with the number of hydrogen atoms. $C_4F_8$ polymerizes mainly on the bottom of the hole at the etch front, which explains its excellent capability in promoting stopping on nitride with vertical profiles. As is known, any hydrogen in the etch chemistry generates a significant amount of sidewall polymer, which typically results in tapered profiles when etching oxide. Hydrogen also increases selectivity to photoresist.

Figure 16:
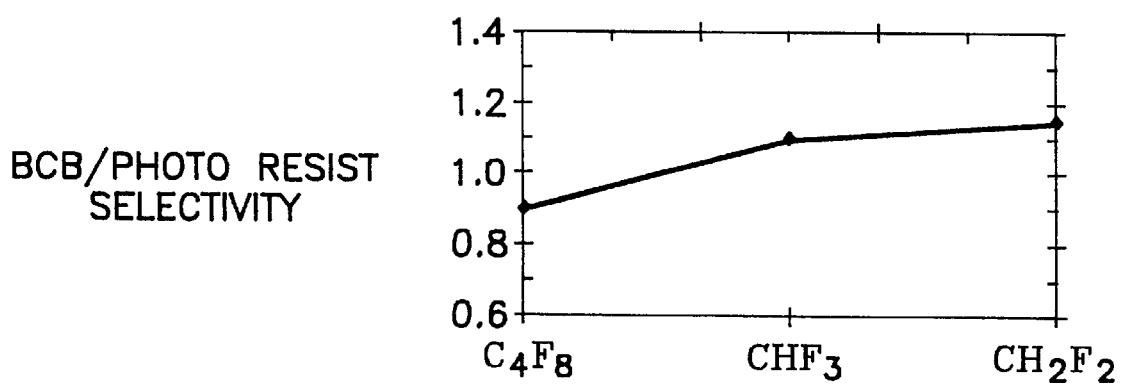
FIG. 16 is a graph of the choice of the fluorocarbon gas and its degree of polymerization upon the selectivity to photoresist in a BCB etch.

The experimentally determined selectivities to BCB over photoresist are plotted in FIG. 16. These results show a significant increase in selectivity to photoresist relative to BCB for the more polymerizing fluorocarbons.

Overall, $CH_2F_2$ seems to be the preferred fluorocarbon. It provided excellent sidewall protection. With 6 sccm of $CH_2F_2$, the least amount of mask faceting was observed for any gas and there was no undercut. However, an excessive flow of $CH_2F_2$ results in a more tapered profile. Both $C_4F_8$ and CHF$_3$ provide less sidewall protection. C$_4$F$_8$ is known to produce a carbon–rich (high C/F ratio) polymer, which concentrates the polymerization at the bottom of the etching hole. Therefore C$_4$F$_8$ is used in oxide etching to obtain vertical profiles and good selectivity to bottom nitride. With 3 sscm of C$_4$F$_8$, there was severe faceting of the hard mask and a slight undercut. Hexafluoroethane (C$_2$F$_6$) provides very poor sidewall protection, presumably because its higher ratio of fluorine to polymer-forning carbon and hydrogen results in reduced polymerization. With 3 sccm of C$_2$F$_6$, the faceting was intermediate those observed for C$_4$F$_8$ and CH$_2$F$_2$, but there was severe undercutting.

Other experiments have shown that when using CH$_2$F$_2$ as fluorocarbon gas a flow of 6 sccm into a 22-liter chamber provides optimum results. Reducing the flow to 3 sccm reduces the BCB etch rate. The results presented in FIGS. 10 and 11 demonstrate that increases in the fluorocarbon flow decreases the BCB etch rate. Thus, the preferred range for CH$_2$F$_2$ flow, taking into consideration the availability of other parameter variations, is between 2 and 18 sccm, a more preferred range being between 3 and 10 sccm. Expressed in terms of the ratio of O$_2$ to CH$_2$F$_2$, O$_2$:CH$_2$F$_2$ ratio should be between 0.55 and 5 and preferably between 1 and 3.3.

A baseline recipe was developed using CH$_2$F$_2$ as the principal etching gas for the BCB trench etch, as tabulated in TABLE 4.

TABLE 4

|  | Trench Etch |
|---|---|
| O$_2$ Flow (sccm) | 10 |
| CH$_2$F$_2$ Flow (sccm) | 3 |
| N$_2$ Flow (sccm) | 20 |
| Outer Source Power (W) | 800 |
| Inner Source Power (W) | 250 |
| Bias Power (W) | 200 |
| Pressure (mT) | 1.8 |
| Roof Temp. (° C.) | 200 |
| Ring Temp. (° C.) | 270 |
| Cathode Temp. (° C.) | −10 |
| Backside He Pressure (T) | 10 |

This recipe was tested on two samples masked for a trench with 750 or 780 nm of photoresist. The first sample was patterned for a 0.37 µm-wide trench and was formed with 80 nm of an organic anti-reflection coating, 100 nm of a TEOS hard mask, and 500 nm of BCB underlaid by more TEOS. With the above recipe, a CO optical emission monitor determined that the BCB was etched through in about 120 seconds, including about 27 seconds for opening the anti-reflection coating and the hard mask. That is, the BCB etch rate was about 300 nm/min. With a 15% over etch, which is necessary to assure that the photoresist completely clears if the BCB is first etched through, the top critical dimension (considered to be the criterion for hard mask faceting) increased by 10 nm, the profile was maintained at between 85° and 87°, and there was no bowing and no undercut. The second sample was patterned with 0.2 µm-wide trenches and had only 32 nm of a dielectric anti-reflection coating. The etching results were similar.

Further tests were performed to establish a process window for the recipe of TABLE 4. Several parameters were separately varied about the baseline value, as shown in TABLE 5.

TABLE 5

|  | Low Value | Baseline | High Value |
|---|---|---|---|
| Total Source Power (W) | 750 | 1050 | 1350 |
| Bias Power (W) | 150 | 250 | 350 |
| O$_2$/N$_2$ | 1:1 | 1:2 | 1:3 |
| Pressure (mT) | 1.8 | 7 | 12 |

The total flow of oxygen and nitrogen was maintained at 30 sccm. The lower pressure was limited by the capacity of the turbo pump. It is believed that similar good results would be obtained down to at least 1 milliTorr.

The experiments clearly show that high pressure degrades the profile and increases the critical dimensions. Higher pressure also increases the BCB etch rate to about 360 nm/min for both pressure levels. As expected from earlier experiments, high ion energy (higher bias power) and longer over etch time increase the hard mask faceting and therefore increases the critical dimension. Higher bias power also increases the BCB etch rate to 375 nm/min while lower bias power decreases etch rate and slightly degrades the profile. Higher source power gives an interesting result. The BCB etch rate dramatically dropped while the photoresist cleared at approximately the same time. These two effects can be explained by the fact that the ion energy is independent of the inductively coupled source power only to first order. In reality, there is a second-order influence of source power on the ion energy, especially at low bias power. Hence, in the used process regime, the ion energy was selected to be very low, obviously too low for a reasonable etch rate. On the other hand, no bias power is required for stripping the photoresist, as is common in most resist ashing processes. Accordingly, the bias power should be increased, consistent with the previous observation that bias power is the main control know for BCB etch rate. A high O$_2$:N$_2$ ratio (that is, a high O$_2$ flow) increases the BCB etch rate to about 360 nm/min but results in BCB undercut because of excess oxygen.

The experimental results show both that the photoresist is prone to being etched away and that the amount of oxygen significantly affects the etched structure, increasing the undercut and substantially increasing the BCB etch rate. We have observed that the BCB etch rate increases substantially after the photoresist has been cleared, which is understandable if the amount of oxygen limits the etching of BCB and of the photoresist until the photoresist clears. This effect should become significant when the BCB thickness is increased relative to that of the photoresist, for example, in a self-aligned dual-damascene etch or counterbore dual-darnascene via etch, in which case the lower part of the BCB is etched without the photoresist. It has also been observed that the baseline recipe of TABLE 4 tends to isotropically etch the photoresist, resulting in a tapered etch of the photoresist. In this case, the hard mask shoulder is prematurely exposed to the high-density plasma, thus tending to increase the faceting of the hard mask and as a result degrading the CD control.

The processes presented above were explained in the context of self-aligned dual damascene. The alternative, counterbore dual damascene, is being considered for other advanced applications. One of its advantages is that its photolithographic alignment is much easier than in a self-aligned dual-damascene process. Alignment introduces severe problems with advanced features sizes of 0.25 μm and less. Which of the two processes is preferred depends on the details of the structure and process.

Figure 17:
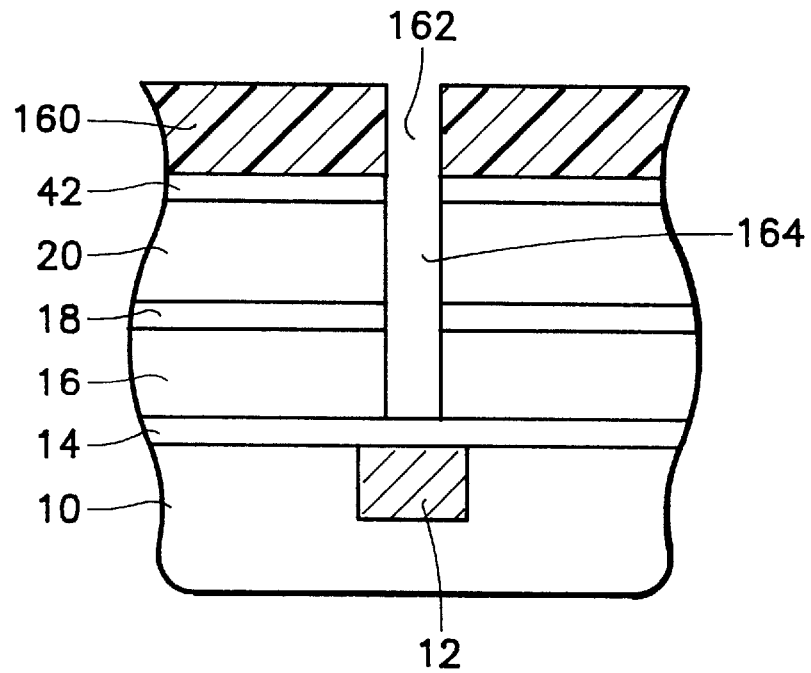
FIGS. 17 and 18 are cross-sectional views of two steps in a counterbore dual-damascene etch.
Figure 18:
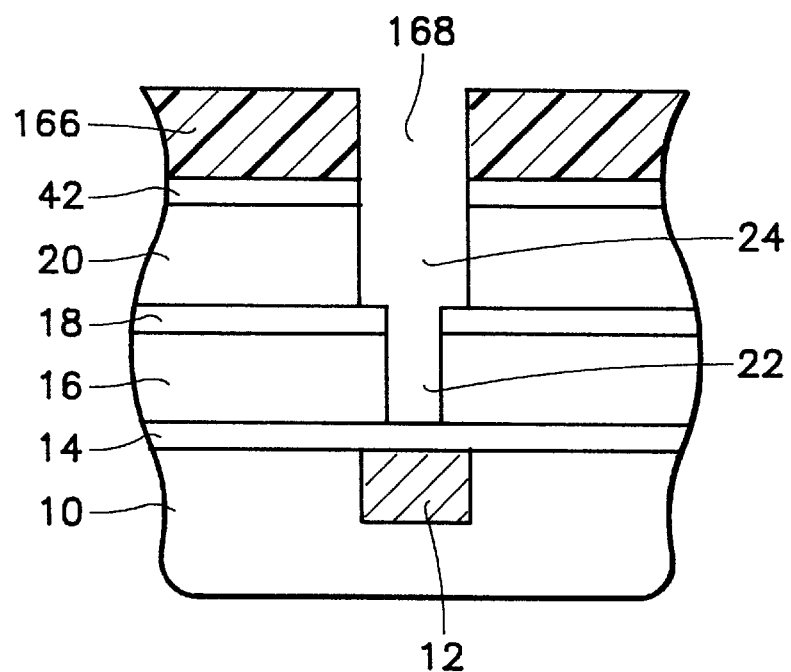

The counterbore process, which was briefly described before, also produces the dual-damascene structure of FIG. 1, but, as illustrated in the cross-sectional view of FIG. 17, begins with an unpatterned structure of the lower and upper stop layers 14, 18, the lower and upper dielectric layers 16, 20, and the hard mask layer 42. It is sometimes preferred that the hard mask 42 be composed of TEOS oxide while the lower and upper stop layers 14, 18 are composed of silicon nitride ($SiN_x$). The TEOS oxide does not offer much selectivity relative to BCB, but it has a lower dielectric constant than nitride. An anti-reflection coating (ARC) may be deposited over the hard mask 42 to aid photographic patterning. A first photoresist layer 160 is deposited over the unpatterned structure and is patterned with a via etch aperture 162. The first counterbore etch step is a deep via etch extending from the hard mask 42 to the lower stop layer 14 and forming an extended via hole 164. In the second photolithographic step, as illustrated in FIG. 18, a second photoresist layer 166 is deposited and patterned to form a trench etch aperture 168. The trench etch extends through the remaining portions of the hard mask 42 and the upper dielectric layer 20 but stops at or in the upper stop layer 18 to form the trench 24 connecting several vias.

Of course, both of these photolithographic steps (via and trench etch) have to start with opening the hard mask 42 before the BCB can be etched. Further, because the upper stop layer 18 has not been patterned for the via etch, the via etch has to punch through this oxide. Since the hard mask 42 is also composed of oxide and the photoresist 160 will be cleared before via etch hits the lower stop layer 14, a two-step process is required for the via etch. The first step will need to etch both the oxide upper stop layer 18 and at least the upper BCB layer 20, and therefore this step requires an anisotropic resist etch to protect the underlying oxide hard mask 42. After punching through the upper stop layer 18 and before or immediately after clearing the photoresist, a second etch step, highly selective to oxide is necessary.

During the entire period of the trench etch, the lower stop layer 14 is exposed on the bottom of the via hole 22, thus requiring high selectivity over nitride in the counterbore trench etch.

This mechanism can be accommodated within the counterbore dual-damascene via etch in which the oxide trench stop layer 18 is etched along with the surrounding BCB dielectric layers 16, 20. Until the trench stop layer 18 is pierced, photoresist 160 is typically still protecting the hard mask 42 on top of the upper BCB layer 20. In the first step, a fluorocarbon-rich chemistry will provide the desired anisotropically selective resist etch with the addition of oxygen for etching BCB. Bias power can be increased, resulting in higher ion energy, because the photoresist is still protecting the hard mask. The high bias power is required for a reasonable BCB etch rate in light of the high fluorine flow and to achieve appreciable oxide etching. Furthermore, the high bias power provides increased selectivity to photoresist. Hence, the recipe for the first step will be similar to a standard oxide etch recipe except for the addition of oxygen. Such a recipe is summarized in TABLE 6.

TABLE 6

|  | First Step | Second Step |
| --- | --- | --- |
| $O_2$ (sccm) | 30 | 10 |
| $C_4F_8$ (sccm) | 10 | 0 |
| Ar (sccm) | 40 | 0 |
| $C_2F_6$ (sccm) | 20 | 0 |
| $CH_2F_2$ (sccm) | 0 | 3–6 |
| $N_2$ (sccm) | 0 | 20 |
| Outer Source Power (W) | 950 | 800 |
| Inner Source Power (W) | 300 | 250 |
| Bias Power (W) | 750 | 200 |
| Pressure (mT) | <5 | 1.8 |
| Roof Temp. (° C.) | 200 | 200 |
| Ring Temp. (° C.) | 270 | 270 |
| Cathode Temp. (° C.) | −10 | −10 |
| Backside He Pressure (T) | 10 | 10 |

The first step is designed to retain the photoresist as long as possible even at a loss of BCB etch rate. This step has been tested. The BCB etch rate was only 300 nm/min and selectivity to photoresist was about 0.75.

In the second step, the difluoromethane is intended for sidewall protection, and the nitrogen for sidewall charge neutralization. The difluoromethane flow of 6 sccm was adopted as the best. The elimination of the fluorocarbon with a high F/C protects the exposed hard mask.

Although these results are acceptable, attempts were made to improve the recipe with a $CH_2F_2/CHF_3$ chemistry. Photoresist selectivity increased to above 1.0 and the etch rate to above 400 nm/min. However, striations were observed in the initial tests, but they should be easily removed with further process optimization. An increase in the bias power should increase the BCB etch rate.

Because the recipe provided for the first step exhibits low selectivity to the oxide hard mask, the step needs to be terminated as soon as the photoresist has been cleared. This can be accomplished by setting the time for the etch to end just before the resist has been determined by separate experiment to clear. Alternatively, tight end point control can be implement with optical emission spectra (OES) utilizing a photo detector 170, illustrated in FIG. 8, coupled to a optical fiber 172 mounted to the chamber wall to view the plasma processing region 100. The detector 170 includes one or more optical filters to pick out the CO or other plasma emission associated with photoresist byproducts. The detector output is input to a system controller 174. The various etching recipes have been input on optical or magnetic media into the controller 174 and stored there so it can control the processing conditions, principally of which for the present invention are dictated by the bank of mass flow controllers 98, the RF power supplies, 84, 108, 110, and the throttle valve 126. Once the controller 174 detects that the photoresist has cleared, it changes between steps of the recipe. For the CO emission line, both BCB and photoresist provide CO signal strength. However, because of the much larger area of the photoresist, the signal drop associated with photoresist clearing is larger than the drop associated with BCB substantially clearing at the stop layer. Tsang et al. disclose in U.S. Pat. No. 5,262,279 using OES as an end-point detector for photoresist over polyimide, but they use the $CH_3$* emission line. If a nitride stop layer is being used, monitoring a rise in the CN line with the photo detector 170 would indicate when the nitride has been reached.

The second step etches only the remaining BCB or a small amount of photoresist. The flow of the oxygen-containing gas should be low to prevent BCB undercutting, but due to the absence of oxygen-consuming photoresist in this step the BCB etch rate will be increased despite the reduction in supplied oxygen. However, from the first to the second step, the fluorocarbon flow needs to be reduced much more than the oxygen flow because the etch needs to change from a low selectivity over oxide to high selectivity over oxide. Nonetheless, the total amount of oxygen is also reduced in order to prevent any oversupply of oxygen once the photoresist has cleared. A low fluorocarbon flow gives enough sidewall protection and higher selectivity to the hard mask than in the first step. The bias power should be reduced to reduce faceting of the hard mask. These conditions are generally those used to establish the baseline recipe of TABLE 4, which is replicated in TABLE 6 for the second step. The recipe shows a reduction in oxygen flow by a factor of three between the two steps while the fluorocarbon-to-oxygen ratio decreases from 1:1 to 3:10. Preferred ranges for the both the oxygen reduction and the reduction in the fluorocarbon-to-oxygen ratio are reduction factors of 1.5 to 6.

After patterning of the trench mask, the trench can be etched with the recipe given in TABLE 4, including a hard mask open step.

The sample reported for the first via step was further subjected to etching in the second via step with the recipe of TABLE 6. The etch rate measured for the second step is 500 nm/min. The hard mask is barely touched even though it was exposed throughout the second step. The second step also exhibits good selectivity of BCB etch to the underlying etch stop layer of $SiN_x$, with virtually no loss observed.

The above examples did not use argon in the etching gas, except for the first step of the counterbore via etch of TABLE 6 in which both oxide and BCB need to be etched. Since the oxide etch needs heavy ion bombardment, a certain amount of sputtering component (argon) is needed since argon or other chemically inactive gases primarily act as a sputterer in this chemistry. A higher argon flow would increase the hard mask faceting. As a result, argon should be minimized or eliminated without compromising the etch characteristics, such as etch rate, selectivity, and profile control.

The above examples all used BCB as the carbon-based low-k dielectric. However, the invention can be used for other carbon-based dielectrics, one example of which is parylene. If silicon is not present in the alternative carbon-based materials, the fluorocarbon component of the etching gas is not so necessary.

One commercially important low-k dielectric material is SILK, which is available also from Dow Chemical and has a dielectric constant of about 2.6. It resembles BCB in its composition except that it does not contain silicon. That is, it is a carbonaceous polymer. It also is spun on and cured to form three-dimensional polymeric linkages. Its glass transition temperature is about 450° C., which better fits with standard silicon processing than the glass transition temperature of 350° C. for BCB.

Since SILK lacks silicon, fluorine is not required to etch it, which benefits the protection of an oxide hard mask. A test sample was fabricated having a silicon nitride base layer to determine the nitride selectivity. Over the nitride was formed a SILK layer having a thickness of about 1.1 μm covered by a TEOS oxide hard mask layer having a thickness of about 120 nm. Photoresist then covered the hard mask layer and was patterned to form 0.4 μm-wide trenches with a period of 1.2 μm. A two-step etch recipe was developed, as summarized in TABLE 7.

TABLE 7

|  | Mask Open | Main Etch |
|---|---|---|
| $C_4F_8$ (sccm) | 10 | 0 |
| $C_2F_6$ (sccm) | 20 | 0 |
| Ar (sccm) | 50 | 0 |
| $O_2$ (sccm) | 0 | 30 |
| $N_2$ (sccm) | 0 | 20 |
| Outer Source Power (W) | 800 | 800 |
| Inner Source Power (W) | 250 | 200 |
| Bias Power (W) | 1500 | 450 |
| Throttle Valve (%) | 100 | 100 |
| Roof Temp. (° C.) | 200 | 200 |
| Ring Temp. (° C.) | 270 | 270 |
| Cathode Temp. (° C.) | −10 | −10 |
| Backside He Pressure (T) | 10 | 10 |
| Time (s) | 12 | 93 |

The first step is a fairly conventional oxide etch recipe to open the TEOS hard mask. The second step is the main etch for the carbon-based SILK. The listed throttle valve opening corresponds to a pressure of somewhat less than 5 milliTorr. The bias power in the main etch corresponds to a DC bias of greater than −250 VDC.

The SILK etching gas contained no substantial amount of fluorocarbon or other fluorine-containing gas and no argon working gas. Oxygen and nitrogen were present in approximately equal amounts, a 4:1 ratio one way or the other being a preferred range and a 2:1 ratio being a more preferred range. These amounts and the pressure resemble some of the BCB etching recipes except for the lack of fluorine. The source power settings are in the regime of a high-density plasma, and the high bias power in both steps produces anisotropic etching.

The results were very good. The SILK etch rate was about 800 nm/min, and the etching profile was between 88° and 89°. The etching rate uniformity over the wafer was 2.6%, and microloading was less than 2%. The selectivity of the main etch of SILK over nitride was about 40:1, and the hard mask faceting was acceptable with no significant loss of critical dimension. As a result, selectivity to photoresist is not a major concern. There was slight inward tapering toward the bottom of the oxide hole. As a result, SILK or other silicon-free carbon-based dielectrics can be incorporated into a dual damascene structure, and an integrated etch process can be optimized.

When the main etch recipe for SILK was modified to have increased oxygen, there was more undercutting. With no nitrogen, there was severe undercutting.

Although the invention was developed to provide a dual-damascene etch, other structures incorporating a carbon-based layer can advantageously use other aspects of the invention.

Although the invention was tested in the inductively coupled IPS etch reactor, other plasma etch reactors may be used, whether using other types of inductive coupling, purely capacitive coupling, remote plasma sources, or electron cyclotron resonance (ECR) among others. However, it is advantageous to separately bias the pedestal and power the plasma source region. The use of a high-density plasma is not believed to be crucial but nonetheless seems to provide superior performance.

As described, the invention provides an advantageous etching chemistry for carbon-based materials included within complicated structures, such as the dual-damascene inter-level dielectric structure. It relies upon regularly used and relatively benign gases and may be practiced in commercially available plasma etch reactors. It offers the advantage of providing a low-k dielectric desired for advanced integrated circuits.

What is claimed is:

1. A method of etching a carbon-based dielectric material, comprising the steps of:
   placing a substrate containing the carbon-based dielectric material overlaid with a patterned hard mask into a plasma reactor;
   flowing into said reactor a gas mixture comprising an oxygen-containing gas, a fluorocarbon, and nitrogen;
   maintaining a pressure in said reactor of less than 5 milliTorr;
   and exciting said gas mixture into a plasma.

2. The method of claim 1, wherein said carbon-based dielectric material comprises a minor fraction of silicon.

3. The method of claim 2, wherein said carbon-based dielectric material comprises a polymer formed from divinyl siloxane benzocyclobutene.

4. The method of claim 3, wherein said hard mask comprises silica.

5. The method of claim 1, wherein said hard mask comprises silica.

6. The method of claim 1, wherein said pressure is maintained at greater than 3 mTorr.

7. The method of claim 1, further comprising holding said substrate at a temperature of no more than 0° C. while it is being etched.

8. The method of claim 1, wherein said exciting step excites said gas mixture into a high density plasma.

9. The method of claim 1, wherein said exciting step includes inductively coupling RF energy into said reactor.

10. The method of claim 1, wherein a flow of said nitrogen is between one and three times a flow of said oxygen-containing gas.

11. The method of claim 10, wherein said oxygen-containing gas comprises oxygen.

12. The method of claim 1, wherein said oxygen-containing gas comprises oxygen.

13. The method of claim 1, wherein said fluorocarbon comprises octafluorocyclobutane.

14. The method of claim 13, wherein said oxygen-containing gas comprises oxygen gas and a ratio of said oxygen gas to said octafluorocyclobutane lies in a range extending from 6 to 10.

15. The method of claim 1, wherein said carbon-based material is overlaid with a silicon-based masking layer and a patterned photoresist layer.

16. The method of claim 1, wherein said gas mixture contains substantially no argon.

17. A method of etching a carbon-based dielectic material, comprising the stps of:
   placing a subtrate containing the carbon-based dielectric material overlaid with a patterned hard mask into a plasma reactor;
   flowing into said reactor a gas mixture comprising an oxygen-containing gas, difluoroethane, and nitrogen; and
   exciting said gas mixture into a plasma.

18. The method of claim 17, wherein said oxygen-containing gas comprises oxygen gas and a ratio of said oxygen gas to said difluoroethane lies in a range extending between 0.55 and 5.

19. The method of claim 18, wherein said range extends from greater than 1.0 to 3.3.

20. A method of etching a carbon-based dielectric material, comprising the steps of:
   placing a substrate containing the carbon-based dielectric material overlaid with a pattern hard mask into a plasma reactor;
   flowing into said reactor a gas mixture comprising carbon monoxide, a fluorocarbon, and nitrogen; and
   exciting said as mixture into a plasma.

21. A method of etching a carbon-based dielectric material, comprising the steps of:
   placing a substrate containing the carbon-based dielectric material overlaid with a patterned hard mask into a plasma reactor;
   flowing into said reactor a gas mixture comprising an oxygen-containing gas, a fluorocarbon, and nitrogen, wherein said flowing step includes a first substep of flowing a first amount of said oxygen-containing gas followed by a second substep of flowing a second amount of said oxygen-containing gas less than said first amount; and
   exciting said gas mixture into a plasma.

22. The method of claim 21, wherein a change between said first and second substeps corresponds to a clearing of organic photoresist over said hard mask.

23. A method of etching a hole in a carbon-based dielectric material, comprising the steps of:
   disposing in a plasma reactor a substrate containing the carbon-based dielectric material overlaid with a patterned hard mask surrounding an area in which said hole is to be etched;
   flowing into said reactor a gas mixture comprising a first amount of an oxygen-containing gas and a second amount of nitrogen at least equal to said first amount;
   maintaining a pressure in said reactor of less than 5 milliTorr; and exciting said gas mixture into a plasma to thereby etch said hole.

24. The method of claim 23, wherein said oxygen-containing gas comprises oxygen gas.

25. The method of claim 23, wherein a ratio of said second amount to said first amount is greater than 1:1 and less than 1:3.

26. The method of claim 23, further comprising maintaining a pressure in said chamber at no more than 18 mTorr.

27. The method of claim 23, wherein said carbon-based material comprises a minor silicon fraction and wherein said gas mixture additionally comprises a fluorocarbon gas.

28. The method of claim 23, wherein said gas mixture contains substantially no argon.

29. The method of claim 23, wherein said gas mixture contains substantially no hydrogen gas.

30. A process for etching a substrate including a substantially silicon-free carbon-based dielectric overlaid with a silicon oxide hard mask and underlaid by a silicon nitride stop layer, comprising:
   flowing into a plasma reaction chamber a etching gas mixture comprising a first amount of oxygen and a second amount of nitrogen and containing substantially no fluorine-containing gas, said first and second amounts differing by no more than a factor of four;
   applying RF bias power to a pedestal electrode supporting said substrate; and
   exciting said etching gas mixture into a plasma.

31. The process of claim 30, wherein said first and second amounts differ by no more than a factor of two.

32. The process of claim 30, wherein said plasma is a high-density plasma.

33. The process of claim 30, wherein said applying step self-biases said pedestal electrode to at least −250 VDC.

34. The process of claim 30, further comprising maintaining a pressure in said chamber of no more than 5 milliTorr during said exciting step.

35. The process of claim 30, wherein said etching gas mixture contains substantially no argon.

36. The method of claim 30, wherein said etching gas mixture contains substantially no argon.

37. The method of claim 30, wherein said etching gas mixture contains substantially no hydrogen gas.

38. A process for etching a substrate including a substantially silicon-free carbon-based dielectric overlaid with a silicon oxide hard mask and underlaid by a silicon nitride stop layer, comprising:

flowing into a plasma reaction chamber a etching gas mixture consisting essentially of a first amount of oxygen and a second amount of nitrogen and containing substantially no fluorine-containing gas, said first and second amounts differing by no more than a factor of four;

applying RF bias power to a pedestal electrode supporting said substrate; and exciting said etching gas mixture into a plasma.

39. The process of claim 38, wherein said etching gas mixture contains substantially no argon.

40. A method of etching a carbon-based dielectric material, comprising the steps of:

placing a substrate containing the carbon-based dielectric material overlaid with a patterned hard mask into a plasma reactor;

flowing into said reactor a gas mixture comprising an oxygen-containing gas, a hydrofluoromethane, and nitrogen and including substantially no argon; and exciting said gas mixture into a plasma.

41. The method of claim 40, further comprising maintaining a pressure in said reactor of less than 5 milliTorr.

42. A method of etching a hole in a carbon-based dielectric material, comprising the steps of:

disposing in a plasma reactor a substrate containing the carbon-based dielectric material overlaid with a patterned hard mask surrounding an area in which said hole is to be etched;

flowing into said reactor a gas mixture comprising a first amount of an oxygen-containing gas and a second amount of nitrogen at least equal to said first amount and including substantially no argon and substantially no fluorine-containing gas; and exciting said gas mixture into a plasma to thereby etch said hole.

43. The method of claim 42, further comprising maintaining a pressure in said reactor of less than 5 milliTorr.

44. The method of claim 42, wherein said carbon-based dielectric material contains substantially no silicon.

\* \* \* \* \*